US012787554B2

(12) United States Patent
Kim et al.

(10) Patent No.: US 12,787,554 B2

(45) Date of Patent: Nov. 3, 2026

(54) DISPLAY PANEL AND MANUFACTURING METHOD OF THE SAME

(71) Applicant: Samsung Display Co., Ltd., Yongin-si (KR)

(72) Inventors: Sunho Kim, Yongin-si (KR); Juchan Park, Yongin-si (KR); Yoomin Ko, Yongin-si (KR); Hyewon Kim, Yongin-si (KR); Pilsuk Lee, Yongin-si (KR); Chung Sock Choi, Yongin-si (KR); Sungjin Hong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 462 days.

(21) Appl. No.: 18/490,814

(22) Filed: Oct. 20, 2023

(65) Prior Publication Data

US 2024/0138201 A1 Apr. 25, 2024
US 2024/0237420 A9 Jul. 11, 2024

(30) Foreign Application Priority Data

Oct. 21, 2022 (KR) ........................ 10-2022-0136818

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/131* (2023.02); *H10K 71/233* (2023.02); *H10K 59/8792* (2023.02)

(58) Field of Classification Search
CPC ............. H10K 59/122; H10K 59/1201; H10K 59/131; H10K 71/233; H10K 59/8792;
(Continued)

(56) References Cited

U.S. PATENT DOCUMENTS

| | | | |
|---|---|---|---|
| 10,978,672 | B2 | 4/2021 | Lee et al. |
| 2019/0207150 | A1 | 7/2019 | Kwon et al. |
| 2020/0328376 | A1 | 10/2020 | Seo et al. |

FOREIGN PATENT DOCUMENTS

| | | |
|---|---|---|
| JP | 2015-122198 | 7/2015 |

OTHER PUBLICATIONS

Partial European Search Report for European Patent Application No. 23204784.5, dated Feb. 7, 2024.

*Primary Examiner* — Elmito Breval
(74) *Attorney, Agent, or Firm* — Harness, Dickey & Pierce, P.L.C.

(57) ABSTRACT

A display panel includes a transistor, a first insulation layer disposed on the transistor, a pixel definition layer disposed on the first insulation layer and having a light emitting opening and an opening pattern surrounding the light emitting opening, a light emitting element disposed on the first insulation layer and including a first electrode at least a portion of which is exposed by the light emitting opening and a second electrode which is electrically connected to the transistor, and a connection line disposed on the transistor and electrically connecting the transistor and the second electrode. A groove overlapping the opening pattern is defined in the first insulation layer, and a portion of the pixel definition layer protrudes from an edge of the first insulation layer defining the groove toward an inside of the opening pattern.

22 Claims, 19 Drawing Sheets

(51) Int. Cl.

| | |
|---|---|
| ***H10K 59/131*** | (2023.01) |
| ***H10K 71/20*** | (2023.01) |
| *H10K 59/80* | (2023.01) |

(58) Field of Classification Search

CPC ............ H10K 59/124; H10K 59/8052; H10K 59/123; H10K 59/1213; H10K 59/12; H10K 50/81; H10K 50/822; H10K 71/00

See application file for complete search history.

DISPLAY PANEL AND MANUFACTURING METHOD OF THE SAME

CROSS-REFERENCE TO RELATED APPLICATIONS

This U.S. non-provisional patent application claims priority under 35 U.S.C. § 119 of Korean Patent Application No. 10-2022-0136818, filed in the Korean Intellectual Property Office (KIPO) on Oct. 21, 2022, the entire contents of which are hereby incorporated by reference.

BACKGROUND

The disclosure herein relates to a display panel and a manufacturing method thereof, and more specifically, to a display panel with improved reliability and a manufacturing method thereof.

Multimedia electronic devices such as televisions, mobile phones, tablets, computers, navigation system units, and game consoles are equipped with a display panel for displaying images. The display panel includes a light emitting element and a pixel driver for driving the light emitting element. Light emitting elements generate an image by emitting light according to electrical properties controlled by the pixel driver. In order to improve the reliability of a display panel, research on the connection between a light emitting element and a pixel driver is being conducted.

SUMMARY

The disclosure provides a display panel with improved electrical reliability and capable of readily implementing a high resolution.

The disclosure also provides a method for manufacturing a display panel, the method having improved process reliability.

The technical objectives to be achieved by the disclosure are not limited to those described herein, and other technical objectives that are not mentioned herein would be clearly understood by a person skilled in the art from the description of the disclosure.

An embodiment of the disclosure provides a display panel including a transistor, a first insulation layer disposed on the transistor, a pixel definition layer disposed on the first insulation layer and having a light emitting opening and an opening pattern surrounding the light emitting opening, a light emitting element disposed on the first insulation layer and including a first electrode at least a portion of which is exposed by the light emitting opening and a second electrode which is electrically connected to the transistor, and a connection line disposed on the transistor and electrically connecting the transistor and the second electrode, wherein a groove overlapping the opening pattern is defined in the first insulation layer, and a portion of the pixel definition layer protrudes from an edge of the first insulation layer defining the groove toward an inside of the opening pattern.

In an embodiment, a side surface of the pixel definition layer defining the opening pattern, a lower surface of the pixel definition layer exposed from the first insulation layer, and a side surface of the first insulation layer defining the groove may define a tip portion.

In an embodiment, a width of the opening pattern in a direction may decrease as the opening pattern closer to the groove, a width of the groove in the direction may decrease as the groove is farther from the opening pattern, and the minimum width of the opening pattern in the direction may be less than the maximum width of the groove in the direction.

In an embodiment, an etch rate of the first insulation layer may be greater than an etch rate of the pixel definition layer.

In an embodiment, the pixel definition layer may include siloxane, and the first insulation layer may include photosensitive polyimide.

In an embodiment, the display panel may further include a first partition pattern disposed in the groove and spaced apart from the second electrode, and the first partition pattern and the second electrode may include a same material.

In an embodiment, the display panel may further include a second partition pattern disposed in the groove. The light emitting element may further include a middle layer disposed between the first electrode and the second electrode, the second partition pattern and the middle layer may include a same material, and the second partition pattern may be spaced apart from the middle layer.

In an embodiment, the display panel may further include a second insulation layer disposed on a lower side of the first insulation layer and disposed between the transistor and the connection line, and a first contact opening exposing an end portion of the connection line may be defined in the first insulation layer.

In an embodiment, the connection line may include a first layer, a second layer disposed on the first layer, and a third layer disposed on the second layer, the third layer and the first layer including a same material layer, wherein a side surface of the second layer adjacent to the second electrode may be disposed further inside of the connection line than a side surface of each of the first and third layers, and the second electrode may be in contact with the side surface of the second layer.

In an embodiment, a thickness of the third layer overlapping the first contact opening may be less than a thickness of the third layer not overlapping the first contact opening.

In an embodiment, a recessed portion recessed in a thickness direction of the second insulation layer, overlapping the first contact opening, and not overlapping the connection line, may be defined in the second insulation layer.

In an embodiment, an etch rate of the second insulation layer may be less than an etch rate of the first insulation layer.

In an embodiment, the second insulation layer may include an organic insulation material.

In an embodiment, the first insulation layer may include photosensitive polyimide, and the second insulation layer may include siloxane.

In an embodiment, the display may further include a third insulation layer disposed between the second insulation layer and the transistor and including an organic insulation material, and the second insulation layer may include an inorganic insulation material.

In an embodiment of the disclosure, a display panel includes a transistor, a first insulation layer disposed on the transistor, a pixel definition layer disposed on the first insulation layer and having a light emitting opening and an opening pattern surrounding the light emitting opening, a light emitting element disposed on the first insulation layer and including a first electrode at least a portion of which is exposed by the light emitting opening and a second electrode which is electrically connected to the transistor, and a connection line disposed on the transistor and electrically connecting the transistor and the second electrode, wherein a groove overlapping the opening pattern and a first contact opening exposing an end portion of the connection line are defined in the first insulation layer, and the second electrode is electrically connected to the end portion of the connection line.

In an embodiment, the connection line may include a first layer, a second layer disposed on the first layer, and a third layer disposed on the second layer, wherein at the end portion, a side surface of the second layer may be disposed further inside than a side surface of each of the first and third layers, and a portion of the third layer more protruding than the side surface of the second layer may define a first tip portion.

In an embodiment, a portion of the second electrode disposed in the first contact opening may be disposed on the first tip portion, and another portion of the second electrode disposed in the first contact opening may be in contact with the side surface of the second layer.

In an embodiment, the display panel may further include a second insulation layer disposed on a lower side of the first insulation layer and disposed between the transistor and the connection line. The light emitting element may further include a middle layer disposed between the first electrode and the second electrode, a portion of the middle layer may cover an upper surface of the third layer exposed by the first contact opening, and another portion of the middle layer may cover the second insulation layer exposed by the first contact opening.

In an embodiment, a second contact opening corresponding to the first contact opening, spaced apart from the light emitting opening, and surrounded by the opening pattern may be defined in the pixel definition layer, and a planar area of the second contact opening may be substantially equal to or greater than a planar area of the first contact opening.

In an embodiment, the transistor and the connection line may be electrically connected through a contact-hole passing through the second insulation layer.

In an embodiment, a portion of the pixel definition layer may protrude from an edge of the first insulation layer defining the groove toward an inside of the opening pattern, and a side surface of the pixel definition layer defining the opening pattern, a lower surface of the pixel definition layer exposed from the first insulation layer, and a side surface of the first insulation layer defining the groove may define a second tip portion.

In an embodiment of the disclosure, a method for manufacturing a display panel includes providing a preliminary display panel including a transistor, a first insulation layer disposed on the transistor, a pixel definition layer disposed on the first insulation layer and having a light emitting opening, and a first electrode disposed on the first insulation layer and exposed by the light emitting opening, etching the pixel definition layer and the first insulation layer to form an opening pattern surrounding the light emitting opening in the pixel definition layer and to form a groove corresponding the opening pattern in the first insulation layer, and providing a second electrode on the first electrode, wherein an etch rate of the first insulation layer is greater than an etch rate of the pixel definition layer.

In an embodiment, the method may further include forming a mask pattern having a first mask opening corresponding to the opening pattern, after the providing of the preliminary display panel and before the etching of the pixel definition layer and the first insulation layer, and removing the mask pattern, after the etching of the pixel definition layer and the first insulation layer and before the providing of the second electrode.

In an embodiment, the mask pattern may include a transparent conductive oxide.

In an embodiment, the preliminary display panel may further include a connection line disposed between the transistor and the first insulation layer and electrically connected to the transistor, wherein a second contact opening overlapping an end portion of the connection line may be defined in the pixel definition layer, the forming of a mask pattern may include defining in the mask pattern a second mask opening corresponding to the second contact opening and overlapping the end portion of the connection line, the etching of the pixel definition layer and the first insulation layer may include forming in the first insulation layer a first contact opening corresponding to the second mask opening and exposing the end portion of the connection line, and the providing of the second electrode on the first electrode may include causing the second electrode to be in contact with the end portion of the connection line.

In an embodiment, the method may further include forming a tip portion in the connection line, after the etching of the pixel definition layer and the first insulation layer and before the removing of the mask pattern.

In an embodiment, the etching of the pixel definition layer and the first insulation layer may be performed by a dry etching method.

In an embodiment, the etching of the pixel definition layer and the first insulation layer may include forming a portion of the pixel definition layer protruding from an edge of the first insulation layer defining the groove toward an inside of the opening pattern.

In an embodiment, the preliminary display panel may further include a second insulation layer disposed between the transistor and the first insulation layer and including at least one of an organic insulation material and an inorganic insulation material, wherein an etch rate of the second insulation layer may be less than the etch rate of the first insulation layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
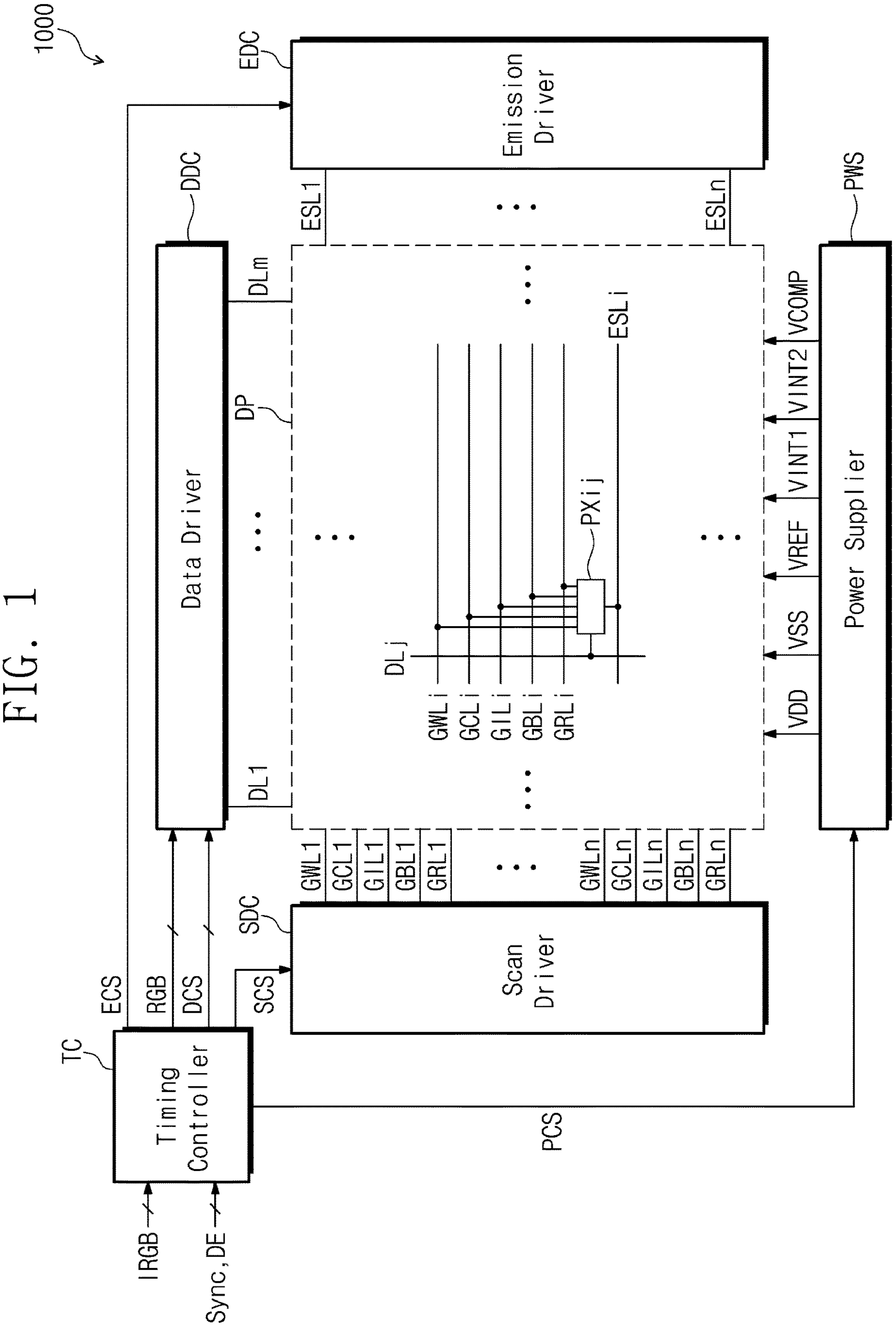
FIG. 1 is a schematic block diagram of a display device according to an embodiment of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Like reference numerals and/or reference characters refer to like elements. Also, in the drawings, the thickness, the ratio, and the dimensions of elements may be exaggerated for an effective description of technical contents.

It will be understood that, although the terms "first," "second," and the like may be used herein to describe various elements, these elements should not be limited by these terms. These terms are only used to distinguish one element from another. For example, a first element may be referred to as a second element, and a second element may also be referred to as a first element in a similar manner without departing the scope of rights of the disclosure. The terms of a singular form may include the terms of a plural form unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the term "comprise," "include," or "have" is intended to specify the presence of stated features, integers, steps, operations, elements, components, or combinations thereof in the disclosure, but do not preclude the presence or addition of one or more other features, integers, steps, operations, elements, components, or combinations thereof.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in excessively ideal a sense or an overly formal sense unless explicitly defined herein.

Hereinafter, embodiments of the disclosure will be described with reference to the accompanying drawings.

FIG. 1 is a block diagram of a display device 1000 according to an embodiment of the disclosure.

Referring to FIG. 1, the display device 1000 may include a timing controller TC, a panel driver, and a display panel DP. In the embodiment, the display panel DP may be described as a light emitting-type display panel. The light emitting-type display panel may include an organic light emitting display panel or a quantum dot light emitting display panel. The panel driver may include a scan driver SDC, an emission driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include pixels connected to the scan lines GWL1 to GWLn, GCL1 to GCLn, GIL1 to GILn, GBL1 to GBLn, and GRL1 to GRLn, emission lines ESL1 to ESLn, and data lines DL1 to DLm. (wherein, m and n are integers greater than 1).

For example, a pixel PXij (wherein i and j are integers greater than 1) positioned at an i-th horizontal line (or, an i-th pixel row) and a j-th vertical line (or, a j-th pixel column) may be connected to an i-th first scan line GWLi, an i-th second scan line GCLi, an i-th third scan line GILi, an i-th fourth scan line GBLi, an i-th fifth scan line GRLi, a j-th data line DLj, and an i-th emission line ESLi.

The pixel PXij may include transistors and capacitors. The pixel PXij may be supplied with a first power voltage VDD (or a first driving voltage), a second power voltage VSS (or a second driving voltage), a third power voltage VREF (or a reference voltage), a fourth power voltage VINT1 (or a first initialization voltage), a fifth power voltage VINT2 (or a second initialization voltage), and a sixth power voltage VCOMP (or a compensation voltage) through a power supplier PWS.

The voltage values of the first power voltage VDD and the second power voltage VSS may be set such that a current flows in a light emitting element. For example, the first power voltage VDD may be set to a voltage higher than the second power voltage VSS.

The third power voltage VREF may be a voltage for initializing a gate of a driving transistor included in the pixel PXij. The third power voltage VREF may be used to implement a gray scale (e.g., a predetermined or selectable gray scale) by using a voltage difference with a data signal. To this end, the third power voltage VREF may be set to a voltage (e.g., a predetermined or selectable voltage) within a voltage range of the data signal.

The fourth power voltage VINT1 may be a voltage for initializing a storage capacitor included in the pixel PXij. The fourth power voltage VINT1 may be set to a voltage lower than the third power voltage VREF. For example, the fourth power voltage VINT1 may be set to a voltage lower than a difference between the third power voltage VREF and a threshold voltage Vth of the driving transistor. For example, the fourth power voltage VINT1 may be set to be in a range of about 4 V to about 12 V. In case that the fourth power voltage VINT1 is set to a potential of about 4 V or greater, it may be possible to readily overcome characteristics of an N-type transistor. However, an embodiment of the disclosure is not limited thereto.

The fifth power voltage VINT2 may be set to a DC voltage. The fifth power voltage VINT2 may be a voltage for initializing a cathode of a light emitting element included in the pixel PXij.

The sixth power voltage VCOMP may supply a current (e.g., a predetermined or selectable current) to the driving transistor in case that the threshold voltage of the driving transistor is compensated.

Each of the fifth and sixth power voltages VINT2 and VCOMP may be set to a voltage lower than the first power voltage VDD or the fourth power voltage VINT1 or may be set to a voltage similar (or close) to or the same as the third power voltage VREF, but the embodiment of the disclosure is not limited thereto, and each of the fifth and sixth power voltages VINT2 and VCOMP may be set to a voltage similar to or the same as the first power voltage VDD.

FIG. 1 illustrates that the first to sixth power voltages VDD, VSS, VREF, VINT1, VINT2, and VCOMP are all supplied from the power supplier PWS, but the embodiment of the disclosure is not limited thereto. For example, the first power voltage VDD and the second power voltage VSS may be all supplied regardless of a structure of the pixel PXij, and at least one of the third power voltage VREF, the fourth power voltage VINT1, the fifth power voltage VINT2, and the sixth power voltage VCOMP may not be supplied in correspondence to the structure of the pixel PXij.

In an embodiment of the disclosure, signal lines connected to the pixel PXij may be variously set in correspondence to a structure of the pixel PXij.

The scan driver SDC may receive a first control signal SCS from the timing controller TC, and may supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn based on the first control signal SCS.

The scan signal may be set to a gate-on voltage such that transistors which are supplied with the scan signal may be turned on.

For example, a scan signal supplied to a P-channel metal oxide semiconductor (PMOS) may be set to a low logic level, and a scan signal supplied to an N-channel metal oxide semiconductor (NMOS) may be set to a high logic level. Hereinafter, the meaning of "a scan signal is supplied" may be understood as that a scan signal is supplied at a logic level which turns on a transistor controlled by the scan signal.

In FIG. 1, for convenience of description, the scan driver SDC is illustrated as having a single configuration, but the embodiment of the disclosure is not limited thereto. According to an embodiment, scan drivers may be included to supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The emission driver EDC may supply an emission signal to the emission lines ESL1 to ESLn based on a second control signal ECS. For example, the emission signal may be supplied sequentially to the emission lines ESL1 to ESLn.

Transistors connected to the emission lines ESL1 to ESLn of the disclosure may be configured as NMOS transistors. The emission signal supplied to the emission lines ESL1 to ESLn may be set to a gate-on voltage (e.g., a high logic level). Transistors receiving an emission signal may be turned on in case that the emission signal is supplied, and may be set to the state of being turned-off otherwise.

The second control signal ECS may include an emission start signal and clock signals, and the emission driver EDC may be implemented as a shift register which sequentially shifts the emission start signal in a pulse form by using the clock signals so as to sequentially generate and output an emission signal in a pulse form.

The data driver DDC may receive a third control signal DCS and image data RGB from the timing controller TC. The data driver DDC may convert the image data RGB in a digital form into an analog data signal (i.e., a data signal). The data driver DDC may supply a data signal to the data lines DL1 to DLm in correspondence to the third control signal DCS.

The third control signal DCS may include a data enable signal, a horizontal start signal, a data clock signal, and the like, which indicate the output of a valid data signal. For example, the data driver DDC may include a shift register configured to shift a horizontal start signal in synchronization with a data clock signal to generate a sampling signal, a latch configured to latch the image data RGB in response to the sampling signal, a digital-to-analog converter (or a decoder) configured to convert the latched image data (e.g., data in a digital form) into data signals in an analog form, and buffers (or amplifiers) configured to output the data signals to the data lines DL1 to DLm.

The power supplier PWS may supply the first power voltage VDD, the second power voltage VSS, and the third power voltage VREF for driving the pixel PXij to the display panel DP. In addition, the power supplier PWS may supply at least one of voltage among the fourth power voltage VINT1, the fifth power voltage VINT2, and the sixth power voltage VCOMP to the display panel DP.

As an example, the power supplier PWS may respectively supply the first power voltage VDD, the second power voltage VSS, the third power voltage VREF, the fourth power voltage VINT1, the fifth power voltage VINT2, and the sixth power voltage VCOMP to the display panel DP via a first power line VDL (or a first driving voltage line, see FIG. 2A), a second power line VSL (or a second driving voltage line, see FIG. 2A), a third power line VRL (or a reference voltage line, see FIG. 2A), a fourth power line VIL1 (or a first initialization voltage line, see FIG. 2A), a fifth power line VIL2 (or a second initialization voltage line, see FIG. 2A), and a sixth power line VCL (or a compensation voltage line, see FIG. 2A), which are not illustrated in FIG. 1.

The power supplier PWS may be implemented as a power management IC (PMIC), but is not limited thereto.

The timing controller TC may generate the first control signal SCS, the second control signal ECS, the third control signal DCS, and a fourth control signal PCS based on input image data IRGB, a synchronization signal Sync (e.g., a vertical synchronization signal, a horizontal synchronization signal, etc.), a data enable signal DE, a clock signal, etc. The first control signal SCS may be supplied to the scan driver SDC, the second control signal ECS may be supplied to the emission driver EDC, the third control signal DCS may be supplied to the data driver DDC, and the fourth control signal PCS may be supplied to the power supplier PWS. The timing controller TC may generate the image data RGB (or frame data) by rearranging the input image data IRGB in correspondence to an arrangement of the pixel PXij in the display panel DP.

At least one of the scan driver SDC, the emission driver EDC, the data driver DDC, the power supplier PWS, and the timing controller TC may be formed on the display panel DP, or may be implemented as an integrated circuit and be connected to the display panel DP. In addition, at least two among the scan driver SDC, the emission driver EDC, the data driver DDC, the power supplier PWS, and the timing controller TC may be implemented as one integrated circuit. For example, the data driver DDC and the timing controller TC may be implemented as one integrated circuit.

In the above, the display device 1000 according to an embodiment of the disclosure has been described with reference to FIG. 1, but a display device of the disclosure is not limited thereto. Signal lines may be further added or omitted according to the configuration of a pixel. In addition, the connection relationship between one pixel and signal lines may be changed. In case that any one of the signal lines is omitted, another signal line may replace the omitted signal line.

Figure 2A:
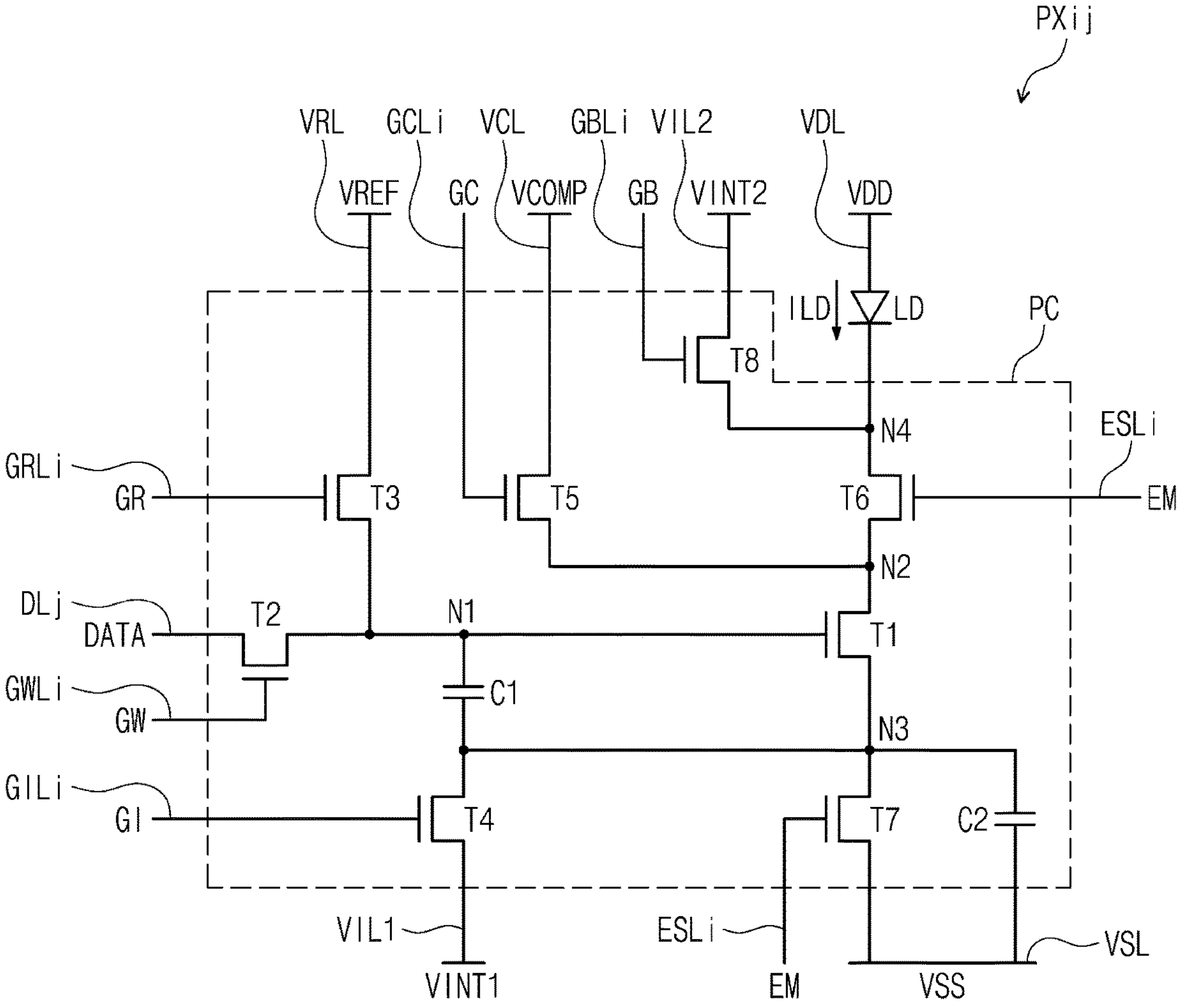
FIG. 2A is a schematic diagram of an equivalent circuit of a pixel according to an embodiment of the disclosure.
Figure 2B:
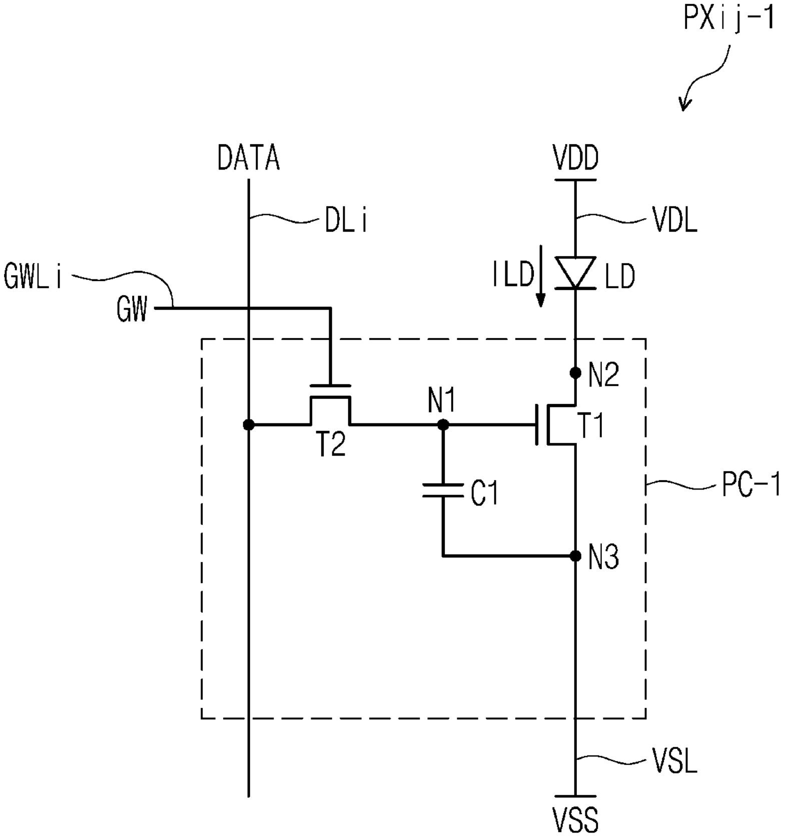
FIG. 2B is a schematic diagram of an equivalent circuit of a pixel according to an embodiment of the disclosure.

FIG. 2A and FIG. 2B are schematic diagrams of equivalent circuits of a pixel according to an embodiment of the disclosure. FIG. 2A and FIG. 2B illustrate schematic diagrams of equivalent circuits of pixels PXij and PXij-1 connected to the i-th first scan line GWLi (hereinafter, a first scan line) and connected to the j-th data line DLj (hereinafter, a data line).

As illustrated in FIG. 2A, the pixel PXij may include a light emitting element LD and a pixel driver PC. The light emitting element LD may be connected to the first driving voltage line VDL and to the pixel driver PC.

The pixel driver PC may be connected to the scan lines GWLi, GCLi, GILi, GBLi, and GRLi, the data line DLj, the emission line ESLi, and the power lines VDL, VSL, VIL1, VIL2, VRL, and VCL. The pixel driver PC may include first to eighth transistors T1, T2, T3, T4, T5, T6, T7, and T8, a first capacitor C1, and a second capacitor C2. Hereinafter, a case in which each of the first to eighth transistors T1, T2, T3, T4, T5, T6, T7, and T8 is an N-type transistor will be described as an example. However, the embodiment of the disclosure is not limited thereto, and some of the first to eighth transistors T1 to T8 may be N-type transistors, and the rest thereof may be P-type transistors, or each of the first to eighth transistors T1 to T8 may be a P-type transistor, and the embodiment of the disclosure is not limited to any one embodiment.

A gate of the first transistor T1 may be connected to a first node N1. A first electrode of the first transistor T1 may be connected to a second node N2, and a second electrode thereof may be connected to a third node N3. The first transistor T1 may be a driving transistor. The first transistor T1 may control a driving current ILD flowing from the first driving voltage line VDL to the second driving voltage line VSL via the light emitting element LD in correspondence to a voltage of the first node N1. The first driving voltage VDD may be set to a voltage having a potential higher than that of the second driving voltage VSS.

In the disclosure, "being electrically connected between a transistor and a signal line (or between a transistor and a transistor)" means that "a source, a drain, or a gate of a transistor may have an integral shape with a signal line (or a source, a drain, or a gate of a transistor) or may be connected to a signal line (or transistor) through a connection electrode."

The second transistor T2 may include a gate connected to the first scan line GWLi, a first electrode connected to the data line DLj, and a second electrode connected to the first node N1. The second transistor T2 may supply a data signal DATA to the first node N1 in response to a write scan signal GW transmitted through the first scan line GWLi. The second transistor T2 may be a switching transistor. The second transistor T2 may be turned on and electrically connect the data line DLj and the first node N1 in case that the write scan signal GW is supplied to the first scan line GWLi.

The third transistor T3 may be connected between the first node N1 and the reference voltage line VRL. A first electrode of the third transistor T3 may receive the reference voltage VREF through the reference voltage line VRL, and a second electrode of the third transistor T3 may be connected to the first node N1. In the embodiment, a gate of the third transistor T3 may receive a reset scan signal GR through the i-th fifth scan line GRLi (hereinafter, a fifth scan line). The third transistor T3 may be turned on and provide the reference voltage VREF to the first node N1 in case that the reset scan signal GR is supplied to the fifth scan line GRLi.

The fourth transistor T4 may be connected between the third node N3 and the first initialization voltage line VIL1. A first electrode of the fourth transistor T4 may be connected to the third node N3, and a second electrode of the fourth transistor T4 may be connected to a first initialization voltage line VIL1 which provides the first initialization voltage VINT1. A gate of the fourth transistor T4 may receive an initialization scan signal GI through the i-th third scan line GILi (hereinafter, a third scan line). The fourth transistor T4 may be turned on and supply the first initialization voltage VINT1 to the third node N3 in case that the initialization scan signal GI is supplied to the third scan line GILi.

The fifth transistor T5 may be connected between the compensation voltage line VCL and the second node N2. A first electrode of the fifth transistor T5 may receive the compensation voltage VCOMP through the compensation voltage line VCL, and a second electrode of the fifth transistor T5 may be connected to the second node N2 to be electrically connected to the first electrode of the first transistor T1. A gate of the fifth transistor T5 may receive a compensation scan signal GC through the i-th second scan line GCLi (hereinafter, a second scan line). The fifth transistor T5 may be turned on and provide the compensation voltage VCOMP to the second node N2 in case that the compensation scan signal GC is supplied to the second scan line GCLi, and during a compensation period, a threshold voltage Vth of the first transistor T1 may be compensated.

The sixth transistor T6 may be connected between the first transistor T1 and the light emitting element LD. Specifically, a gate of the sixth transistor T6 may receive an emission signal EM through the i-th emission line ESLi (hereinafter, an emission line). A first electrode of the sixth transistor T6 may be connected to a cathode of the light emitting element LD through a fourth node N4, and a second electrode of the sixth transistor T6 may be connected to the first electrode of the first transistor T1 through the second node N2. The sixth transistor T6 may be referred to as a first emission control transistor. The sixth transistor T6 may be turned on and electrically connect the light emitting element LD and the first transistor T1 in case that the emission signal EM is supplied to the emission line ESLi.

The seventh transistor T7 may be connected between the second driving voltage line VSL and the third node N3. A first electrode of the seventh transistor T7 may be connected to the second electrode of the first transistor T1 through the third node N3, and a second electrode of the seventh transistor T7 may receive the second driving voltage VSS through the second driving voltage line VSL. A gate of the seventh transistor T7 may be electrically connected to the emission line ESLi. The seventh transistor T7 may be referred to as a second emission control transistor. The seventh transistor T7 may be turned on and electrically connect the second electrode of the first transistor T1 and the second driving voltage line VSL in case that the emission signal EM is supplied to the emission line ESLi.

In the embodiment, the sixth transistor T6 and the seventh transistor T7 are illustrated as being connected to the same emission line ESLi and turned on through the same emission signal EM, but this is merely an example. In another embodiment, the sixth transistor T6 and the seventh transistor T7 may be independently turned on by different signals distinguished from each other. In addition, in the pixel driver PC according to an embodiment of the disclosure, one of the sixth transistor T6 and the seventh transistor T7 may be omitted. However, the embodiments are not limited thereto.

The eighth transistor T8 may be connected between the second initialization voltage line VIL2 and the fourth node N4. For example, the eighth transistor T8 may include a gate connected to the i-th fourth scan line GBLi (hereinafter, a fourth scan line), a first electrode connected to the second initialization voltage line VIL2, and a second electrode connected to the fourth node N4. The eighth transistor T8 may be referred to as a second initialization transistor. The eighth transistor T8 may supply the second initialization voltage VINT2 to the fourth node N4 corresponding to the cathode of the light emitting element LD in response to a black scan signal GB transmitted through the fourth scan line GBLi. The cathode of the light emitting element LD may be initialized by the second initialization voltage VINT2.

In the embodiment, some of the second to eighth transistors T2, T3, T4, T5, T6, T7, and T8 may be simultaneously turned on through the same scan signal. For example, the eighth transistor T8 and the fifth transistor T5 may be simultaneously turned on through the same scan signal. For example, the eighth transistor T8 and the fifth transistor T5 may be operated through the same compensation scan signal GC. The eighth transistor T8 and the fifth transistor T5 may be turned on/off by the same compensation scan signal GC, so that the eighth transistor T8 and the fifth transistor T5 may be simultaneously turned on/off. In this case, the second scan line GCLi and the fourth scan line GBLi may be provided as substantially a single scan line. Accordingly, initializing the cathode of the light emitting element LD and compensating the threshold voltage of the first transistor T1 may be performed at substantially the same timing. However, this is merely an example, and the embodiment of the disclosure is not limited to any one embodiment.

In addition, according to the disclosure, the initialization the cathode of the light emitting element LD and the compensation the threshold voltage of the first transistor T1 may be achieved with the application of substantially the same power voltage. For example, the compensation voltage line VCL and the second initialization voltage line VIL2 may be provided as substantially a single power line. In this case, since the initialization operation of a cathode and the compensation operation of a driving transistor may be performed with one power voltage, the design of a driver may be simplified. However, this is merely an example, and the embodiment of the disclosure is not limited to any one embodiment.

The first capacitor C1 may be disposed between the first node N1 and the third node N3. The first capacitor C1 may store a charge corresponding to a voltage difference between the first node N1 and the third node N3. The first transistor C1 may be referred to as a storage capacitor.

The second capacitor C2 may be disposed between the third node N3 and the second driving voltage line VSL. For example, one electrode of the second capacitor C2 may be connected to the second driving voltage line VSL which is supplied with the second driving voltage VSS, and the other electrode of the second capacitor C2 may be connected to the third node N3. The second capacitor C2 may store a charge corresponding to a voltage difference between the second power voltage VSS and the third node N3. The second capacitor C2 may be referred to as a hold capacitor. The second capacitor C2 may have a higher storage capacity compared to the first capacitor C1. Accordingly, the second capacitor C2 may minimize a voltage change of the third node N3 in correspondence to a voltage change of the first node N1. However, the embodiments are not limited thereto, and the second capacitor C2 may have a storage capacity substantially equal to or lower than the first capacitor C1.

In the embodiment, the light emitting element LD may be connected to the pixel driver PC through the fourth node N4. The light emitting element LD may include an anode connected to the first driving voltage line VDL and a cathode facing the anode. In the embodiment, the light emitting element LD may be connected to the pixel driver PC through the cathode. For example, in the pixel PXij according to the disclosure, a connection node to which the light emitting element LD and the pixel driver PC are connected may be the fourth node N4, and the fourth node N4 may correspond to a connection node between the first electrode of the sixth transistor T6 and the cathode of the light emitting element LD.

Accordingly, the potential of the fourth node N4 may substantially correspond to the potential of the cathode of the light emitting element LD. For example, the anode of the light emitting element LD may be connected to the first driving voltage line VDL and applied with the first driving voltage VDD, which may be a constant voltage, and the cathode thereof may be connected to the first transistor T1 though the sixth transistor T6. For example, the potential of the second node N2 corresponding to a source of the first transistor T1 may not be directly affected by the characteristics of the light emitting element LD. Therefore, even if the characteristics of the light emitting element LD are deteriorated due to the lifespan of the light emitting element LD and the like, the influence on transistors constituting (or included in) the pixel driver PC, particularly a gate-source voltage Vgs of a driving transistor, may be reduced. For example, since a change width of a current amount due to the deterioration of the light emitting element LD may be reduced, an afterimage defect of the display panel DP (see, e.g., FIG. 1) due to an increase in usage time may be reduced and the lifespan thereof may be improved.

As another example, as illustrated in FIG. 2B, the pixel PXij-1 may include a pixel driver PC-1 including two transistors T1 and T2 and one capacitor C1. The pixel driver PC-1 may be connected to a light emitting element LD, a first scan line GWLi, a data line DLj, and a second driving voltage line VSL. The pixel driver PC-1 illustrated in FIG. 2B may correspond to the pixel driver PC illustrated in FIG. 2A from which the third to eighth transistors T3 to T8 and one capacitor C2 are omitted.

Each of the first and second transistors T1 and T2 may be an N-type transistor or a P-type transistor. In the embodiment, each of the first and second transistors T1 and T2 is described as an N-type transistor as an example. However, the embodiments are not limited thereto.

The first transistor T1 may include a gate connected to a first node N1, a first electrode connected to a second node N2, and a second electrode connected to a third node N3. The second node N2 may be a node connected to an electrode of the light emitting element LD (another electrode thereof connected to a first driving voltage line VDL), and the third node N3 may be a node connected to the side of a second driving voltage line VSL. The first transistor T1 may be connected to the light emitting element LD through the second node N2 and connected to the second driving voltage line VSL through the third node N3. The first transistor T1 may be a driving transistor.

The second transistor T2 may include a gate for receiving a write scan signal GW through the first scan line GWLi, a first electrode connected to the data line DLj, and a second electrode connected to the first node N1. The second transistor T2 may supply a data signal DATA to the first node N1 in response to a write scan signal GW transmitted through the first scan line GWLi.

The capacitor C1 may include an electrode connected to the first node N1 and another electrode connected to the third node N3. The capacitor C1 may store the data signal DATA transmitted to the first node N1.

The light emitting element LD may include an anode and a cathode. In the embodiment, the anode of the light emitting element LD may be connected to the first driving voltage line VDL, and the cathode thereof may be connected to the pixel driver PC-1 through the second node N2. In the embodiment, the cathode of the light emitting element LD may be connected to the first transistor T1. The light emitting element LD may emit light in correspondence to an amount of current flowing in the first transistor T1 of the pixel driver PC-1.

The second node N2 to which the cathode of the light emitting element LD and the pixel driver PC-1 are connected may correspond to a drain of the first transistor T1. The light emitting element LD may be connected to the pixel driver PC-1 through the second node N2. For example, in the pixel PXij-1 illustrated in FIG. 2B, a connection node to which the light emitting element LD and the pixel driver PC-1 are connected may be the second node N2, and the second node N2 may correspond to a connection node between the first electrode of the first transistor T1 and the cathode of the light emitting element LD.

For example, in case that the driving transistor is an N-type transistor, the display panel DP (see, e.g., FIG. 1) of the disclosure may prevent a change in a gate-source voltage of the first transistor T1 caused by the light emitting element LD. Accordingly, since a change width of a current amount due to the deterioration of the light emitting element LD may be reduced, an afterimage defect of the display panel DP due to an increase in usage time may be reduced and the lifespan thereof may be improved.

FIG. 2A and FIG. 2B illustrate equivalent circuits for the pixel drivers PC and PC-1 according to an embodiment of the disclosure, and as long as a display panel DP according to an embodiment of the disclosure is a circuit connected to the cathode of the light emitting element LD, the number or arrangement relationship of transistors and the number or arrangement relationship of capacitors may be designed in various ways and are not limited to any one embodiment.

Figure 3A:
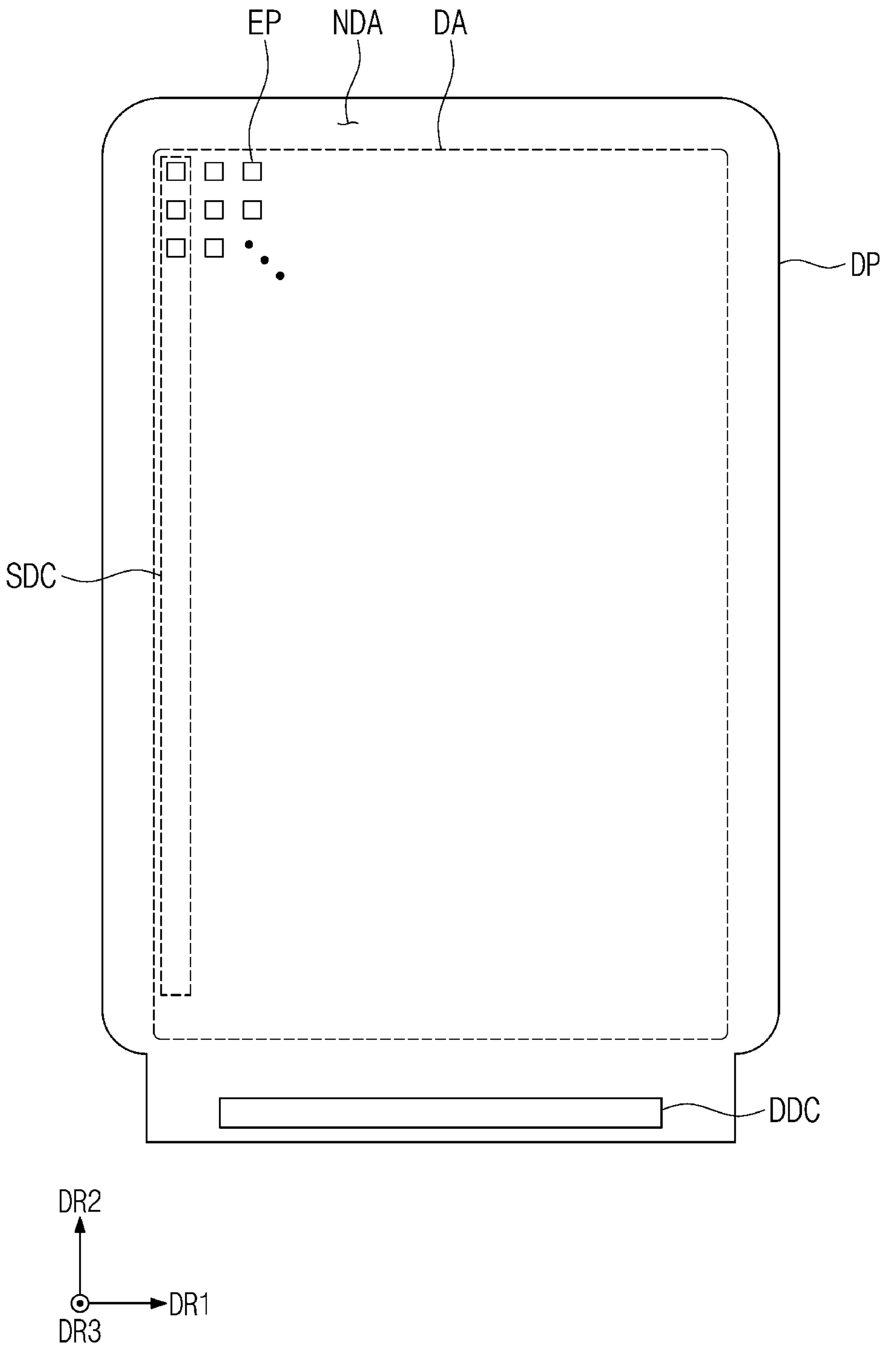
FIG. 3A and FIG. 3B are schematic plan views of a display panel according to an embodiment of the disclosure.
Figure 3B:
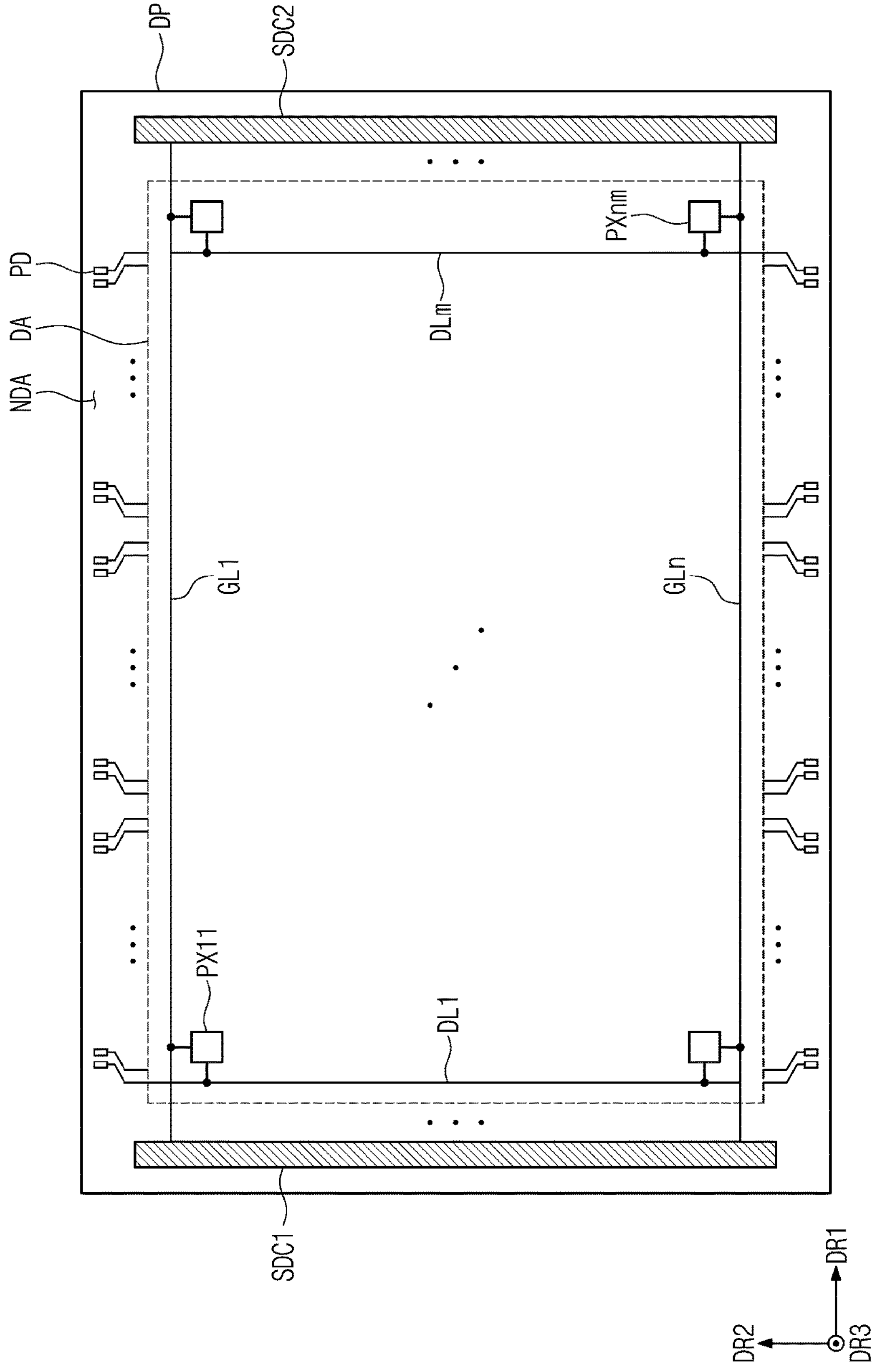

FIG. 3A and FIG. 3B are schematic plan views schematically illustrating display panels according to an embodiment of the disclosure. In each of FIG. 3A and FIG. 3B, some components are omitted, and for convenience of description, some components mounted on the display panel DP are illustrated together. Hereinafter, the disclosure will be described with reference to FIG. 3A and FIG. 3B. Referring to FIG. 3A, the display panel DP of an embodiment may include a display region DA and a peripheral region NDA. The display region DA may include light emitting portions EP.

The light emitting portions EP may be regions emitted by the pixels PXij (see, e.g., FIG. 1), respectively. Specifically, each of the light emitting portions EP may correspond to a light emitting opening OP-E (see, e.g., FIG. 5A) to be described below.

The peripheral region NDA may be disposed adjacent to the display region DA. In the embodiment, the peripheral region NDA is illustrated as having a shape surrounding the display region DA. However, this is illustrated as an example, and the peripheral region NDA may be adjacent to the display region DA (e.g., disposed on one side of the display region DA), or may be omitted, and the embodiments are not limited to any one embodiment.

In the embodiment, a scan driver SDC and a data driver DDC may be mounted on the display panel DP. In an embodiment, the scan driver SDC may be disposed in the display region DA, and the data driver DDC may be disposed in the peripheral region NDA. The scan driver SDC may overlap at least some of the light emitting portions EP disposed in the display region DA, e.g., on a plane (or in a plan view or in a direction). In case that the scan driver SDC is disposed in the display region DA, the area of the peripheral area NDA may be reduced compared to a case that the scan driver is disposed in the peripheral area, and the display device 1000 (see, e.g., FIG. 1) having a narrow bezel may be readily implemented. However, the embodiment of the disclosure is not limited thereto. For example, the scan driver SDC may be disposed in the peripheral region NDA or in both the display region DA and the peripheral region NDA.

Unlike what is illustrated in FIG. 3A, in another embodiment, the scan driver SDC may be provided as two portions separated from each other. The two scan drivers SDC may be disposed spaced apart from each other left and right with the center of the display region DA interposed (or disposed) therebetween. As another example, the scan driver SDC may be provided in a number equal to or greater than 2, and is not limited to any one embodiment.

FIG. 3A illustrates an example of the display device 1000 (see, e.g., FIG. 1), and the data driver DDC may be disposed in the display region DA. Some of the light emitting portions EP disposed in the display region DA may overlap the data driver DDC on a plane.

The data driver DDC may be provided in the form of a separate driving chip independent from the display panel DP and be connected to the display panel DP. However, this is described as an example, and the data driver DDC may be formed in a process in which the scan driver SDC is also formed so as to constitute the display panel DP, and is not limited to any one embodiment.

As another example, as illustrated in FIG. 3B, the display device 1000 (see, e.g., FIG. 1) may include a display panel DP having a longer side in the first direction DR1. In the embodiment, the display device may include scan drivers SDC1 and SDC2. The scan drives SDC1 and SDC2 are illustrated as including a first scan driver SDC1 and a second scan drive SDC2 disposed spaced apart from each other in the first direction DR1.

The first scan driver SDC1 may be connected to some of scan lines GL1 to GLn, and the second scan driver SDC2 may be connected to others of the scan lines GL1 to GLn. For example, the first scan driver SDC1 may be connected to odd-numbered scan lines among the scan lines GL1 to GLn, and the second scan driver SDC2 may be connected to even-numbered scan lines among the scan lines GL1 to GLn.

For ease of description, FIG. 3B illustrates pads PD of the data lines DL1 to DLm. The pads PD may be defined at ends of the data lines DL1 to DLm. The data lines DL1 to DLm may be connected to the data driver DDC (see, e.g., FIG. 3A) through the pads PD.

According to the disclosure, the pads PD may be divided and arranged at positions spaced apart from each other with the display region DA disposed therebetween in the peripheral region NDA. For example, some of the pads PD may be disposed on an upper side, for example, a side adjacent to the first scan line GL1 among the scan lines GL1 to GLn, and others of the pads PD may be disposed on a lower side, for example, a side adjacent to the last scan line GLn among the scan lines GL1 to GLn. In the embodiment, among the pads PD, pads connected to odd-numbered data lines may be disposed on an upper side, and among the pads PD, pads connected to even-numbered data lines may be disposed on a lower side. Although not illustrated, the data driver DDC may include three upper data drivers connected to the pads PD disposed on an upper side and three lower data drivers connected to the pads PD disposed on a lower side. However, this is described as an example, and the pads PD according to an embodiment of the disclosure may be connected through two data drivers respectively provided on the upper side and the lower side. As another example, the pads PD according to an embodiment of the disclosure may be disposed on any one side and connected to a single data driver, and is not limited any one embodiment.

Figure 4A:
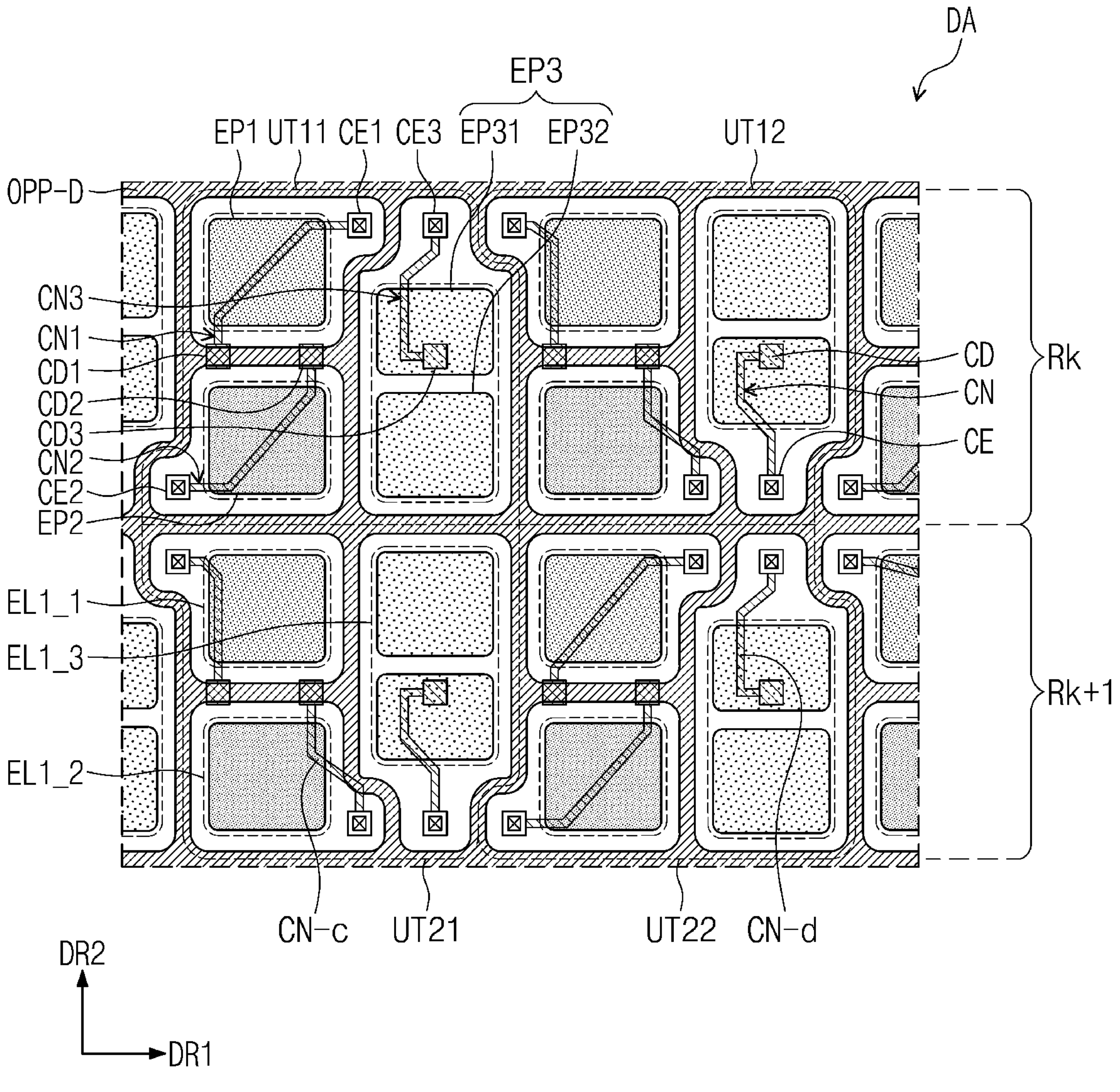
FIG. 4A and FIG. 4B are schematic plan views of some enlarged regions of a display panel according to an embodiment of the disclosure.
Figure 4B:
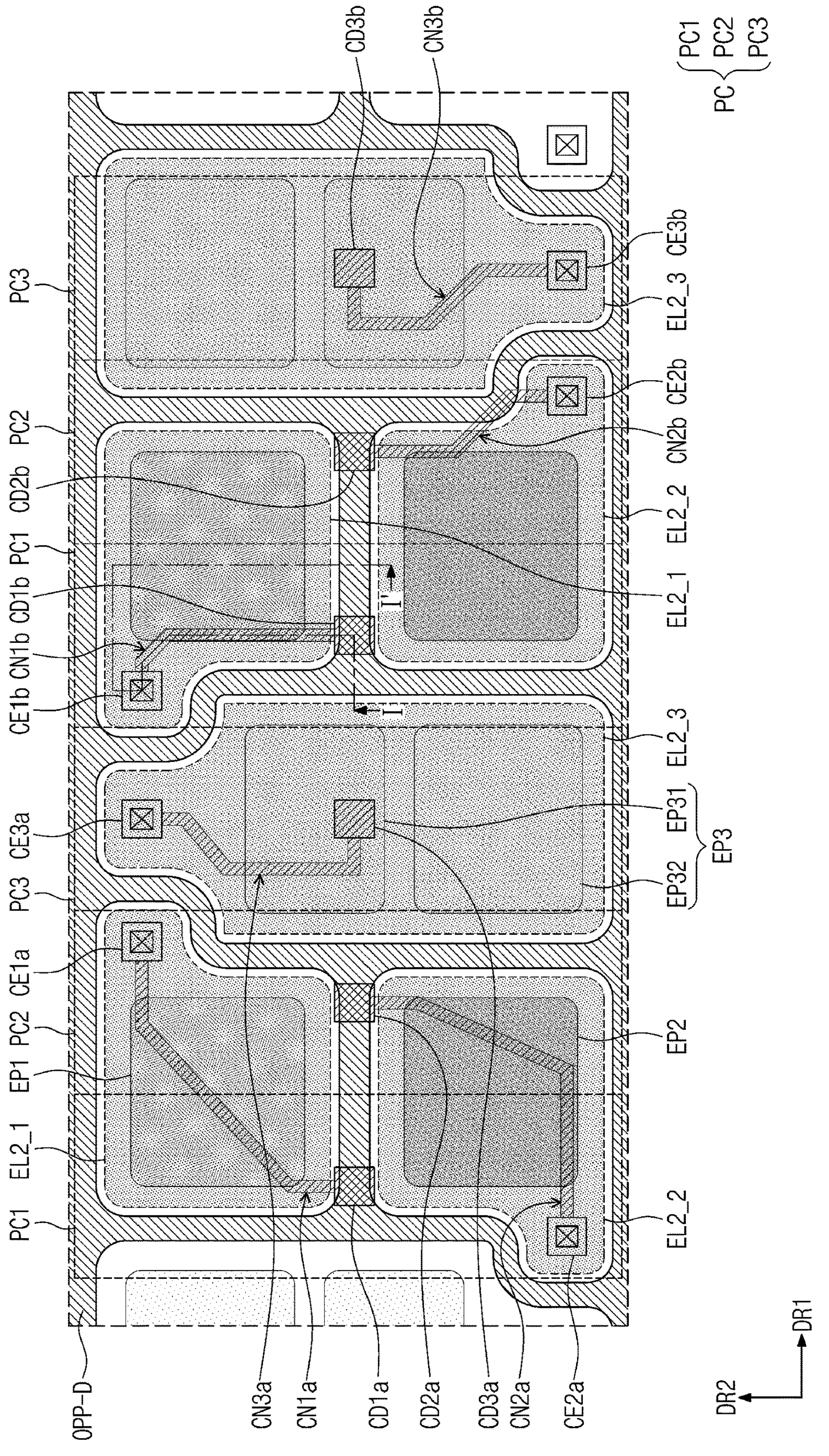

FIG. 4A and FIG. 4B are schematic plan views of some enlarged regions of a display region according to an embodiment of the disclosure.

FIG. 4A illustrates light emitting units (or light emitting parts) UT11, UT12, UT21, and UT22 in 2 rows and 2 columns. The first row light emitting portions Rk may include light emitting portions constituting the first-row first-column light emitting unit UT11 and the first-row second-column light emitting unit UT12, and the second row light emitting portions Rk+1 may include light emitting portions constituting the second-row first-column light emitting unit UT21 and the second-row second-column light emitting unit UT22. Of components of the display panel DP, FIG. 4A and FIG. 4B illustrate light emitting portions EP1, EP2, and EP3, connection lines CN1, CN2, and CN3 (collectively referred to as connection lines CN), anodes (or first electrodes) EL1_1, EL1_2, and EL1_3, and cathodes (or second electrodes) EL2_1, EL2_2, and EL2_3 which are disposed in a region partitioned by a partition opening pattern (or an opening pattern) OPP-D to be described below.

Each of the light emitting portions EP1, EP2, and EP3 may correspond to a light emitting opening OP-E (see, e.g., FIG. 5A) to be described below, may be regions in which light emitted by the light emitting element LD described above (see, e.g., FIG. 2A or FIG. 2B) is displayed, or may be region overlapped by the anode, a light emitting layer, and the cathode constituting the light emitting element LD (see, e.g., FIG. 2A or FIG. 2B).

The light emitting portions EP1, EP2, and EP3 may include a first light emitting portion EP1, a second light emitting portion EP2, and a third light emitting portion EP3. The first light emitting portion EP1, the second light emitting portion EP2, and the third light emitting portion EP3 may display light of different colors from each other. For example, the first light emitting portion EP1 may display red light, the second light emitting portion EP2 may display green light, and the third light emitting portion EP3 may display blue light, but the combination of colors is not limited thereto.

The third light emitting portion EP3 of the light emitting portions EP1, EP2, and EP3 may include two sub-light emitting portions EP31 and EP32 spaced apart from each other in the second direction DR2. However, this is illustrated as an example, and the third light emitting portion EP3 may be provided as one pattern having a shape of a single body like the other light emitting portions EP1 and EP2, or at least one of the other light emitting portions EP1 and EP2 may include sub-light emitting portions, but is not limited to any one embodiment.

In the embodiment, the first row light emitting portions Rk may be composed of light emitting portions in the form in which the first-row first-column light emitting unit UT11 and the first-row second-column light emitting unit UT12 are repeatedly arranged. The second row light emitting portions Rk+1 may be composed of light emitting portions in the form in which the second-row first-column light emitting unit UT21 and the second-row second-column light emitting unit UT22 are repeatedly arranged.

Hereinafter, the first-row first-column light emitting unit UT11 will be described. For ease of description, FIG. 4A illustrates anodes EL1_1, EL1_2, and EL1_3 (hereinafter, first to third anodes) and connection lines CN1, CN2, and CN3, and FIG. 4B illustrates cathodes EL2_1, EL2_2, and EL2_3, pixel drivers PC1, PC2, and PC3, and connection lines CN1, CN2, and CN3.

The cathodes EL2_1, EL2_2, and EL2_3 (hereinafter, first to third cathodes) may be divided from each other by the partition opening pattern OPP-D. A first anode EL1_1 and a first cathode EL2_1 may provide a first light emitting portion EP1, a second anode EL1_2 and a second cathode EL2_2 may provide the second light emitting portion EP2, and a third anode EL1_3 and the third cathode EL2_3 may provide the third light emitting portion EP3.

In the embodiment, one light emitting unit (e.g., the first-row first-column light emitting unit UT11) may include three light emitting portions EP1, EP2, and EP3. Accordingly, one light emitting unit may include three anodes EL1_1, EL1_2, and EL1_3, three cathodes EL2_1, EL2_2, and EL2_3, three pixel drivers PC1, PC2, and PC3 (hereinafter first to third pixel drivers), and three connection lines CN1, CN2, and CN3 (hereinafter, first to third connection lines). However, this is illustrated as an example, and the number and arrangement of the light emitting units (UT11, UT12, UT21, and UT22) may be designed in various ways, and are not limited to any one embodiment.

The first to third pixel drivers PC1, PC2, and PC3 may be connected to light emitting elements constituting the first to third light emitting portions EP1, EP2, and EP3, respectively.

The first to third pixel drivers PC1, PC2, and PC3 may be sequentially disposed in the first direction DR1. Disposition positions of the first to third pixel drivers PC1, PC2, and PC3 may be designed independently of positions or shapes of the first to third light emitting portions EP1, EP2, and EP3.

For example, the first to third pixel drivers PC1, PC2, and PC3 may be disposed in a region partitioned by the partition opening pattern OPP-D, for example, may be disposed at positions different from positions at which the first to third cathodes EL2_1, EL2_2, and EL2_3 are disposed, or may be designed to have a shape different from the shape of the first to third cathodes EL2_1, EL2_2, and EL2_3. As another example, the first to third pixel drivers PC1, PC2, and PC3 may be disposed to respectively overlap positions at which the first to third light emitting portions EP1, EP2, and EP3 are present and may be disposed in a region partitioned by the partition opening pattern OPP-D. For example, the first to third pixel drivers PC1, PC2, and PC3 may be designed in a shape having an area similar to that of the first to third cathodes EL2_1, EL2_2, and EL2_3.

In the embodiment, each of the first to third pixel drivers PC1, PC2, and PC3 is illustrated in a rectangular shape, each of the first to third light emitting portions EP1, EP2, and EP3 is arranged in a different form, and the first to third cathodes EL2_1, EL2_2, and EL2_3 are disposed at positions overlapping the first to third light emitting portions EP1, EP2, and EP3 but are illustrated in irregular shapes.

Accordingly, as illustrated in FIG. 4B, the first pixel driver PC1 may be disposed at a position overlapping the first light emitting portion EP1, the second light emitting portion EP2, and another adjacent light emitting unit. The second pixel driver PC2 may be disposed at a position overlapping the first light emitting portion EP1, the second light emitting portion EP2, and the third light emitting portion EP3. The third pixel driver PC3 may be disposed at a position overlapping the third light emitting portion EP3. This is illustrated as an example, and the positions of the first to third pixel drivers PC1, PC2, and PC3 may be designed in various forms and arrangements independently of the first to third light emitting portions EP1, EP2, and EP3, and are not limited to any one embodiment.

The connection lines CN may be provided in plurality and disposed spaced apart from each other. The connection lines CN may connect between the pixel drivers PC1, PC2, and PC3 and light emitting elements, respectively. Specifically, each of the connection lines CN may correspond to a node (e.g., N4 of FIG. 2A or N2 of FIG. 2B) at which a light emitting element is connected to the pixel drivers PC1, PC2, and PC3.

The connection line CN may include a first connector CE (hereinafter, a light emitting connector) and a second connector CD (hereinafter, a driving connector). The light emitting connector CE is provided on one side of the connection line CN, and the driving connector CD may be provided on the other side of the connection line CN.

The driving connector CD may be a portion of the connection line CN that is connected to the pixel driver PC. In the embodiment, the driving connector CD is connected to one electrode of a transistor constituting the pixel driver PC. Specifically, the driving connector CD may be connected to a drain of the sixth transistor T6 illustrated in FIG. 2A or the drain of the first transistor T1 illustrated in FIG. 2B. Accordingly, the position of the driving connector CD may correspond to the position of a transistor TR (see, e.g., FIG. 5A) physically connected to the connection line CN of the pixel driver PC. The light emitting connector CE may be a portion of the connection line CN that is connected to a light emitting element. In the embodiment, the light emitting connector CE may be connected to the cathodes EL2_1, EL2_2, and EL2_3 of the light emitting element.

A light emitting unit UT may include first to third connection lines CN1, CN2, and CN3. The first connection line CN1 may connect a light emitting element LD (see, e.g., FIG. 2A or FIG. 2B) forming the first light emitting portion EP1 and the first pixel driver PC1, the second connection line CN2 may connect a light emitting element LD (see, e.g., FIG. 2A or FIG. 2B) forming the second light emitting portion EP2 and the second pixel driver PC2, and the third connection line CN3 may connect a light emitting element LD (see, e.g., FIG. 2A or FIG. 2B) forming the third light emitting portion EP3 and the third pixel driver PC3.

Specifically, the first to third connection lines CN1, CN2, and CN3 may connect the first to third cathodes EL2_1, EL2_2, and EL2_3, and the first to third pixel drivers PC1, PC2, and PC3, respectively. The first connection line CN1 may include a first driving connector CD1 connected to the first pixel driver PC1 and a first light emitting connector CE1 connected to the first cathode EL2_1. The second connection line CN2 may include a second driving connector CD2 connected to the second pixel driver PC2 and a second light emitting connector CE2 connected to the second cathode EL2_2. The third connection line CN3 may include a third driving connector CD3 connected to the third pixel driver PC3 and a third light emitting connector CE3 connected to the third cathode EL2_3.

The first to third driving connectors CD1, CD2, and CD3 may be arranged along the first direction DR1. As described above, the first to third driving connectors CD1, CD2, and CD3 may correspond to positions of connection transistors constituting the first to third pixel drivers PC1, PC2, and PC3, respectively. In one pixel, a connection transistor may be a transistor including, as one electrode, a connection node to which a pixel driver and a light emitting element are connected, and may correspond to, for example, the sixth transistor T6 of FIG. 2A or the first transistor T1 of FIG. 2B. According to the disclosure, by designing a pixel driver identically for all pixels regardless of the shape, size, and light emitting color of a light emitting portion, it is possible to simplify processes and reduce costs.

In the embodiment, the first to third light emitting connectors CE1, CE2, and CE3 may be defined at positioned not overlapping the light emitting portions EP1, EP2, and EP3 on a plane. As described above, each of the light emitting connectors CE1, CE2, and CE3 is provided at a position not overlapping the light emitting opening OP-E (see, e.g., FIG. 5A), since the light emitting connector CE (see, e.g., FIG. 5A) of the connection line CN is a portion to which the light emitting element LD (see, e.g., FIG. 5A) is connected and a tip portion TIP1 (see, e.g., FIG. 5A) is defined. That is, in each of the cathodes EL2_1, EL2_2, and EL2_3, the light emitting connectors CE1, CE2, and CE3 may be disposed at positions spaced apart from the light emitting portions EP1, EP2, and EP3, and the cathodes EL2_1, EL2_2, and EL2_3 may include some regions protruding from the light emitting portions EP1, EP2, and EP3 on a plane in order to be connected to the connection lines CN1, CN2, and CN3 at the positions at which the light emitting connectors CE1, CE2, and CE3 are disposed.

For example, the first cathode EL2_1 includes a protruding portion in a shape protruding from the first light emitting portion EP1 at a position not overlapping the first light emitting portion EP1 in order to be connected to the first connection line CN1 at a position at which the first light emitting connector CE1 is disposed. The first light emitting connector CE1 may be provided to the protruding portion of the first cathode EL2_1. Accordingly, the first light emitting connector CE1 which may be connected to the first connection line CN1 without reducing the light emitting area of the first light emitting portion EP1 may be provided. In addition, the first driving connector CD1 which is at the position of the transistor TR (see, e.g., FIG. 5A), may be defined at a position not overlapping the first light emitting portion EP1 on a plane. According to the embodiment, since the first connection line CN1 is disposed in the first light emitting portion EP1, the first cathode EL2_1 and the first pixel driver PC1 spaced apart from each other may be readily connected.

The third pixel driver PC3, in particular, the third driving connector CD3, which is at a position connected to the transistor TR, may be defined at a position not overlapping the third light emitting connector CE3 on a plane and may be disposed at a position overlapping the third light emitting portion EP3. According to the embodiment, since the third cathode EL2_3 and the third pixel driver PC3 are connected through the third connection line CN3, even when the position of the third driving connector CD3 overlaps the third light emitting portion EP3 on a plane, the connection between the third pixel driver PC3 and the third cathode EL2_3 may be facilitated. Accordingly, restrictions according to the position or shape of the third light emitting portion EP3 in the design of the third pixel driver PC3 may be reduced, and the degree of freedom in circuit design may be improved.

In an embodiment, a third light emitting connector CE3*a* disposed in the first-row first-column light emitting unit UT11 may be disposed spaced apart from the corresponding third light emitting portion EP3 in the second direction DR2, and a third light emitting connector CE3*b* disposed in the first-row second-column light emitting unit UT12 may be disposed spaced apart from the corresponding third light emitting portion EP3 in the opposite direction of the second direction DR2.

A first light emitting connector CE1*a* disposed in the first-row first-column light emitting unit UT11 and a first light emitting connector CE1*b* disposed in the first-row second-column light emitting unit UT12 may be disposed spaced apart from each other in the first direction DR1 with the third light emitting connector CE3*a* disposed in the first-row first-column light emitting unit UT11 interposed therebetween. A second light emitting connector CE2*b* disposed in the first-row second-column light emitting unit UT12 and a second light emitting connector disposed in an adjacent light emitting unit (e.g., the first-row and third-column light emitting unit having substantially the same shape and arrangement as those of the first-row and first-column light emitting unit UT11) may be disposed spaced apart from each other in the first direction DR1 with the third light emitting connector CE3*b* disposed in the first-row second-column light emitting unit UT12 interposed therebetween.

In the embodiment, the third light emitting portion EP3 and the third light emitting connector CE3 of the third connection line CN3 constituting the first-row first-column light emitting unit UT11 and the third light emitting portion EP3 and the third light emitting connector CE3 of the third connection line CN3 constituting the first-row second-column light emitting unit UT12 may have shapes and arrangements line-symmetrical with respect to an axis parallel to the first direction DR1 (or, symmetrical vertically based on the second direction DR2). The first and second light emitting portions EP1, EP2 and the first and second light emitting connectors CE1, CE2 of the first and second connection lines CN1, CN2 constituting the first-row first-column light emitting unit UT11 and the first and second light emitting portions EP1, EP2 and the first and second light emitting connectors CE1, CE2 of the first and second connection lines CN1, CN2 constituting the first-row second-column light emitting unit UT12 may have shapes and arrangements line-symmetrical with respect to an axis parallel to the second direction DR2. The second-row light emitting units UT21 and UT22 may substantially be composed of light emitting portions in a form in which the first-row light emitting units UT11 and UT12 are shifted in the first direction DR1. That is, the second-row first-column light emitting unit UT21 may be composed of light emitting portions having substantially the same shape as that of the first-row second-column light emitting unit UT12, and the second-row second-column light emitting unit UT22 may be composed of light emitting portions having substantially the same shape as that of the first-row first-column light emitting unit UT11.

Accordingly, the shape and arrangement form of connection lines CN-c disposed in the second-row first-column light emitting unit UT21 may be substantially the same as those of connection lines CN1*b*, CN2*b*, and CN3*b* (including driving connectors CD1*b*, CD2*b*, and CD3*b* and light emitting connectors CE1*b*, CE2*b*, and CE3*b*) disposed in the first-row second-column light emitting unit UT12. In the same manner, the shape and arrangement form of connection lines CN-d disposed in the second-row second-column light emitting unit UT22 may be substantially the same as those of connection lines CN1*a*, CN2*a*, and CN3*a* (including driving connectors CD1*a*, CD2*a*, and CD3*a* and light emitting connectors CE1*a*, CE2*a*, and CE3*a*) disposed in the first-row first-column light emitting unit UT11.

According to the embodiment, unlike light emitting portions in which a cathode and a connection transistor of a corresponding pixel driver overlap on a plane, light emitting portions including a cathode having a shape not overlapping a connection transistor of a pixel driver further include a connection line, and thus, may be readily connected to the pixel driver. According to the embodiment, by further including a connection line, it is possible to achieve stable connection to a pixel driver by changing only the shape of a cathode without changing the design of light emitting portions. Accordingly, the influence of arrangement or shape of light emitting portions on the connection with the pixel driver may be reduced, so that the degree of freedom in design of the pixel driver may be improved and the degradation in the aperture ratio of a light emitting portion may be prevented.

Figure 5A:
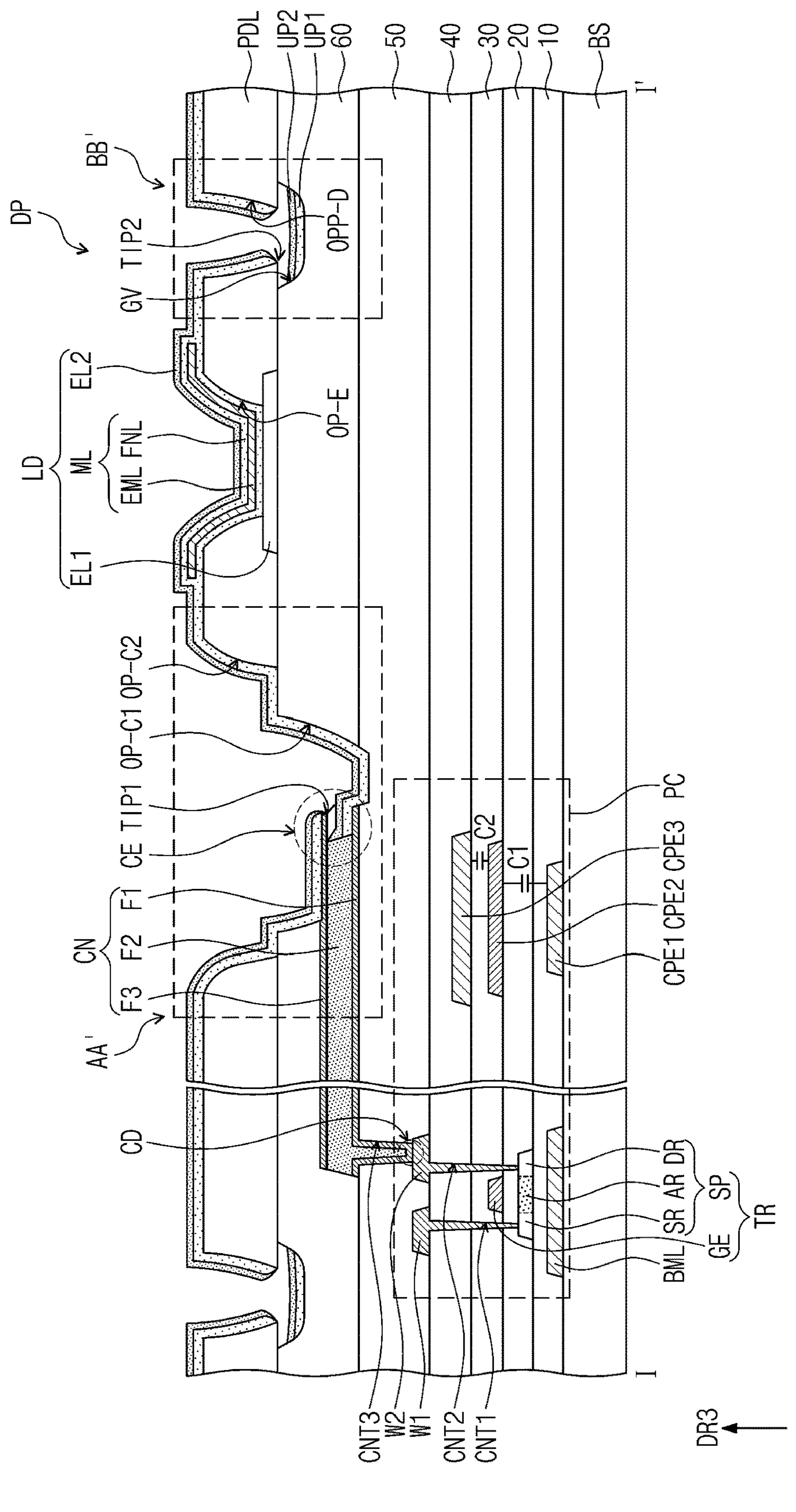
FIG. 5A is a schematic cross-sectional view taken along line I-I' of FIG. 4B of some enlarged regions of a display panel according to an embodiment of the disclosure.
Figure 5B:
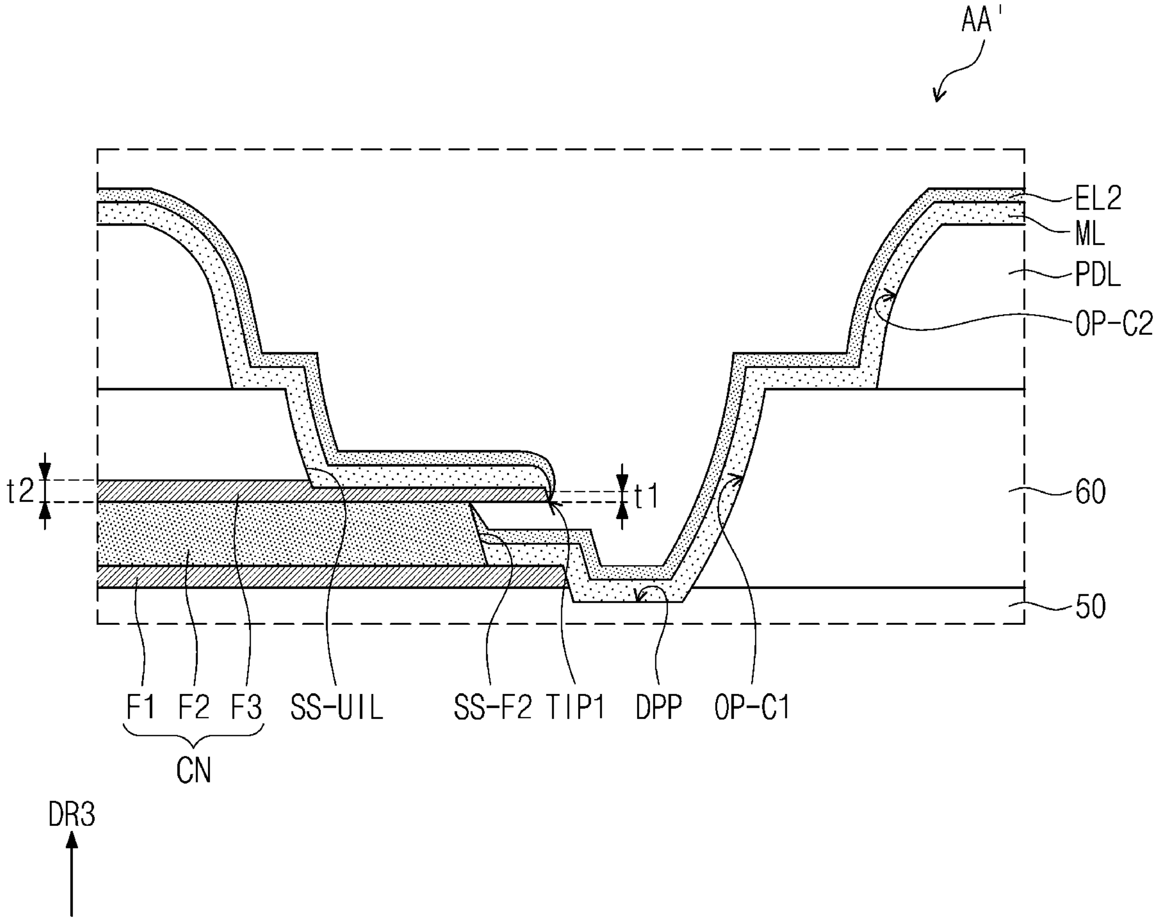
FIG. 5B is a schematic enlarged cross-sectional view of enlarged region AA' of FIG. 5A of a display panel according to an embodiment of the disclosure.
Figure 5C:
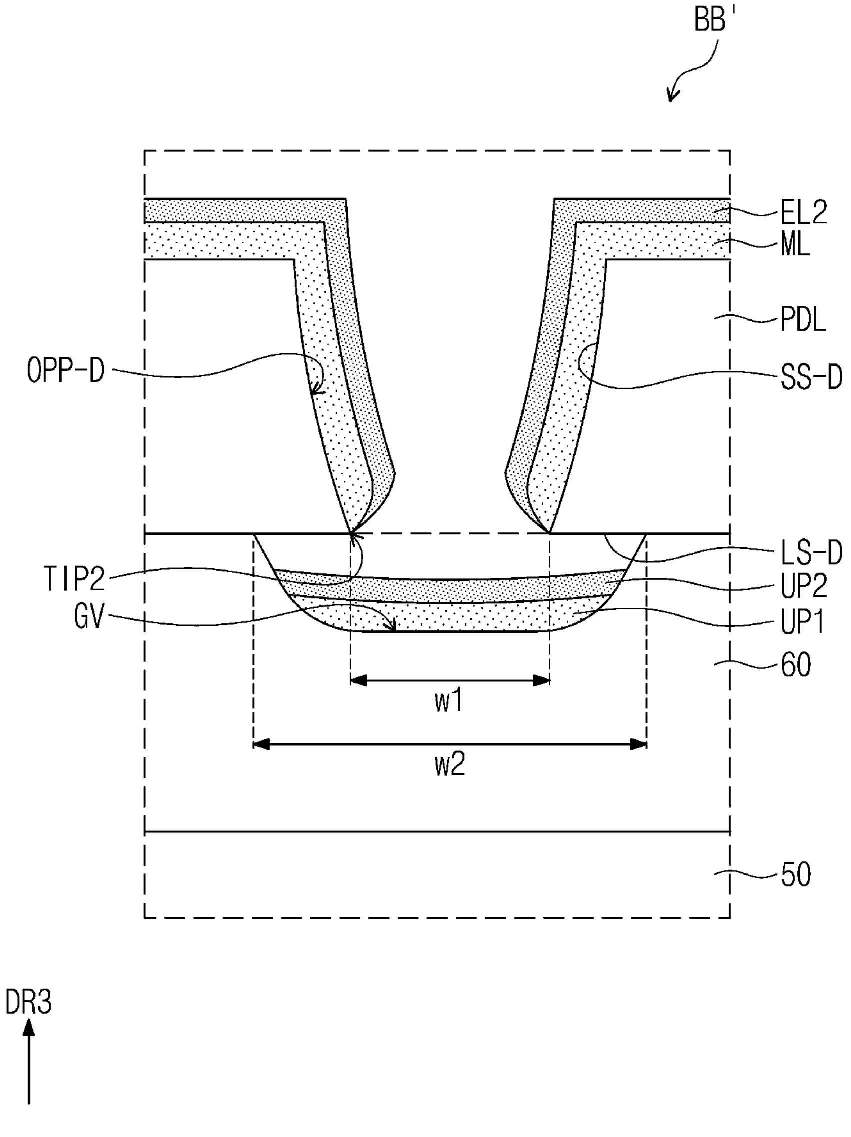
FIG. 5C is a schematic enlarged cross-sectional view of enlarged region BB' of FIG. 5A of a display panel according to an embodiment of the disclosure.
Figure 6:
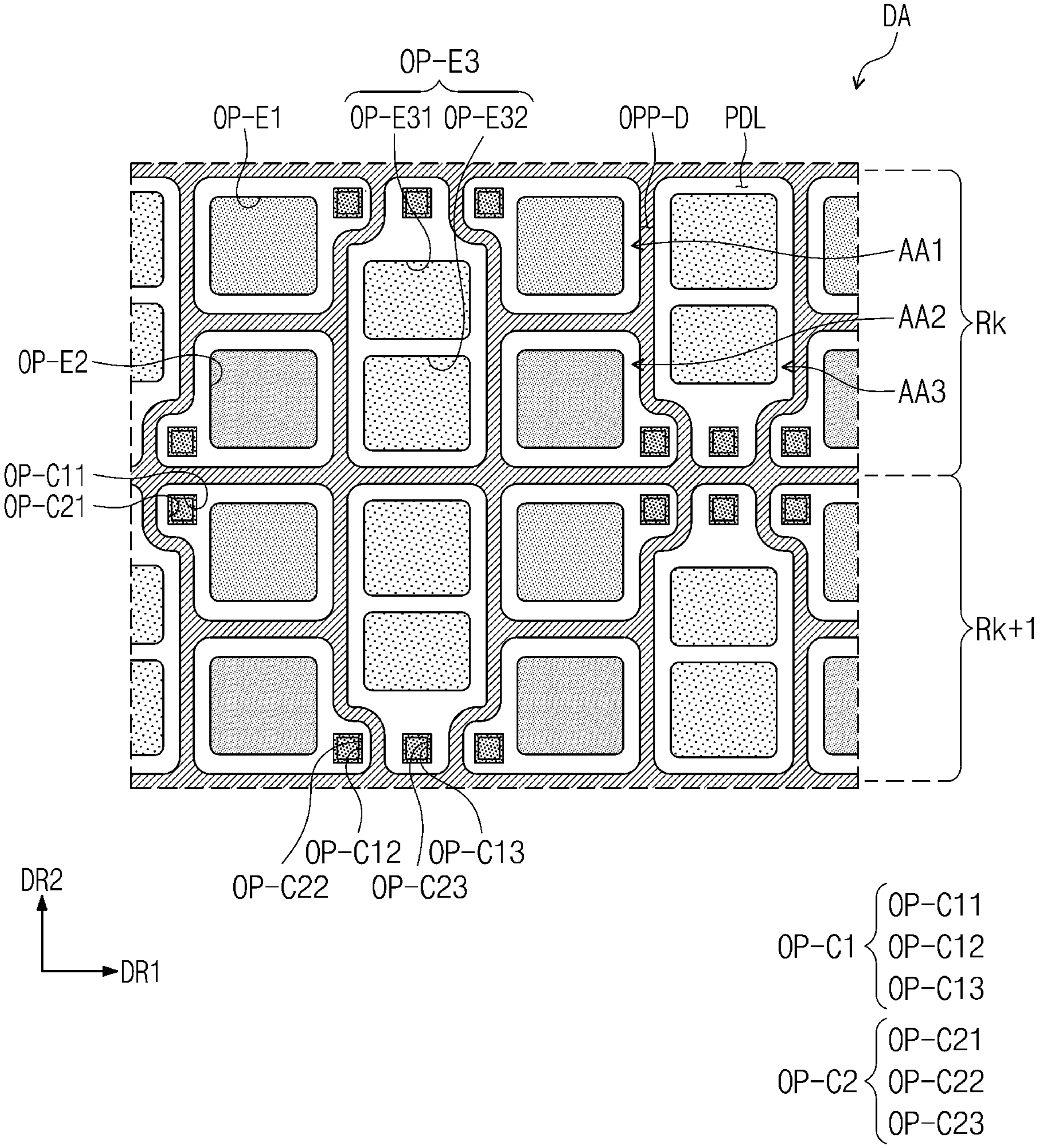
FIG. 6 is a schematic plan view of enlarged components of a display panel according to an embodiment of the disclosure.

FIG. 5A is a cross-sectional view taken along line I-I' of FIG. 4B of some enlarged regions of a display panel according to an embodiment of the disclosure. FIG. 5B is an enlarged cross-sectional view of enlarged region AA' of FIG. 5A of a display panel according to an embodiment of the disclosure. FIG. 5C is an enlarged cross-sectional view of enlarged region BB' of FIG. 5A of a display panel according to an embodiment of the disclosure. FIG. 6 is a plan view of enlarged components of a display panel according to an embodiment of the disclosure.

Referring to FIG. 5A, the display panel DP of an embodiment of the disclosure may include a base layer BS, insulation layers 10, 20, 30, 40, 50, 60, and PDL disposed on the base layer BS, and conductive patterns and semiconductor patterns disposed between the insulation layers. The conductive patterns and the semiconductor patterns are disposed between the insulation layers 10, 20, 30, 40, 50, 60, and PDL, and may constitute the pixel driver PC, the connection line CN, and the light emitting element LD. In FIG. 5A, for ease of description, a cross-section of one region among regions in which one light emitting portion is disposed is illustrated.

The base layer BS may be a member which provides a base surface on which the pixel driver PC is disposed. The base layer BS may be a rigid substrate, or a flexible substrate capable of bending, folding, rolling, and the like. The base layer BS may be a glass substrate, a metal substrate, a polymer substrate, or the like. However, the embodiment of the disclosure is not limited thereto, and the base layer BS may be an inorganic layer, an organic layer, or a composite material layer.

The base layer BS may have a multi-layered structure. The base layer BS may include a first polymer resin layer, a silicon oxide (SiOx) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. In addition, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Meanwhile, in the disclosure, "~~-based" resin means that a functional group of "~~" is included.

Each of insulation layer, conductive layers, and semiconductor layers disposed on the base layer BS may be formed by coating, deposition, or the like. Thereafter, an organic layer, an inorganic layer, a semiconductor layer, and a conductive layer may be selectively patterned through performing a photolithography process times to form a hole in the insulation layer, or to form a semiconductor pattern, a conductive pattern, a signal line, and the like.

On the base layer BS, the first to fifth insulation layers 10, 20, 30, 40, and 50 and the pixel driver PC sequentially laminated may be disposed. FIG. 5A illustrates one transistor TR and two capacitors C1 and C2 in the pixel driver PC. The transistor TR may correspond to a transistor connected to the light emitting element LD through a connection line CN, that is, a connection transistor connected to a node (the fourth node N4 of FIG. 2A, or the second node N2 of FIG. 2B) corresponding to the cathode of the light emitting element LD, and specifically, may correspond to the sixth transistor T6 of FIG. 2A or the first transistor T1 of FIG. 2B. Meanwhile, although not illustrated, other transistors constituting the pixel driver PC may have a structure substantially the same as the structure of the transistor TR (hereinafter, a connection transistor) illustrated in FIG. 5A. However, this is described, and the other transistors constituting the pixel driver PC may have different structures, and are not limited to any one embodiment.

The first insulation layer 10 may be disposed on the base layer BS. The first insulation layer 10 may be an inorganic layer and/or an organic layer, and may have a single-layered or multi-layered structure. The first insulation layer 10 may include at least one of an aluminum oxide, a titanium oxide, a silicon oxide, a silicon nitride, a silicon oxynitride, a zirconium oxide, and a hafnium oxide. In the embodiment, the first insulation layer 10 is illustrated as a single-layered silicon oxide layer. Meanwhile, other insulation layers to be described below may be inorganic layers and/or organic layers, and may have a single-layered structure or a multi-layered structure. The inorganic layer may include at least one of the above-described materials, but is not limited thereto.

Meanwhile, the first insulation layer 10 may cover a lower conductive layer BML. That is, the display panel DP may further include the lower conductive layer BML disposed overlapping the connection transistor TR in a lower portion of the connection transistor TR. The lower conductive layer BML may block an electric potential due to polarization of the base layer BS from affecting the connection transistor TR. In addition, the lower conductive layer BML may block light incident to the connection transistor TR from a lower portion of the lower conductive layer BML. Between the lower conductive layer BML and the base layer BS, at least one of an inorganic barrier layer and a buffer layer may be further disposed.

The lower conductive layer BML may include a reflective metal. For example, the lower conductive layer BML may include titanium (Ti), molybdenum (Mo), an alloy containing molybdenum, aluminum (Al), an alloy containing aluminum, an aluminum nitride (AlN), tungsten (W), a tungsten nitride (WN), copper (Cu), or the like.

In an embodiment, the lower conductive layer BML may be connected to a source (or a source region SR of a semiconductor pattern SP) of the transistor TR through a source electrode pattern W1. In this case, the lower conductive layer BML may be synchronized with the source of the transistor TR. However, the embodiment of the disclosure is not limited thereto, and the lower conductive layer BML may be connected to a gate (or a gate electrode GE) of the transistor TR, thereby being synchronized with the gate. Alternatively, the lower conductive layer BML may be connected to another electrode and be independently applied with a constant voltage or a pulse signal. The lower conductive layer BML may be provided in an isolated form from another conductive pattern. The lower conductive layer BML according to an embodiment of the disclosure may be provided in various embodiments, and is not limited to any one embodiment.

The connection transistor TR is disposed on the first insulation layer 10. The connection transistor TR may include a semiconductor pattern SP and a gate electrode GE. The semiconductor pattern SP may be disposed on the first insulation layer 10. The semiconductor pattern SP may include an oxide semiconductor. For example, the oxide semiconductor may include a transparent conductive oxide (TCO) such as an indium tin oxide (ITO), an indium zinc oxide (IZO), an indium gallium zinc oxide (IGZO), a zinc oxide (ZnO), an indium oxide ($In_2O_3$), or the like. However, the embodiment of the disclosure is not limited thereto, and the semiconductor pattern may include amorphous silicon, low-temperature polycrystalline silicon, or polycrystalline silicon.

The second insulation layer 20 commonly overlaps pixels, and may cover the semiconductor pattern SP. The second insulation layer 20 may be an inorganic layer and/or an organic layer, and may have a single-layered or a multi-layered structure. The second insulation layer 20 may include at least one of an aluminum oxide, a titanium oxide, a silicon oxide, a silicon nitride, a silicon oxynitride, a zirconium oxide, and a hafnium oxide. In the embodiment, the second insulation layer 20 may be a single-layered silicon oxide layer.

The semiconductor pattern SP may include the source region SR, a drain region DR, and a channel region AR (or an active) which are divided according to the degree of conductivity. The channel region AR may be a portion overlapping the gate electrode GE on a plane. The source region SR and the drain region DR may be portions spaced apart from each other with the channel region AR interposed therebetween. When the semiconductor pattern SP is an oxide semiconductor, the source region SR and the drain region DR may each be a reduced region. Accordingly, the source region SR and the drain region DR have a relatively high reduced metal content ratio compared to that of the channel region AR. Alternatively, when the semiconductor pattern SP is polycrystalline silicon, the source region SR and the drain region DR may each be a region doped to a high concentration.

The source region SR and the drain region DR may have relatively high conductivity compared to that of the channel region AR. The source region SR may correspond to a source electrode of the connection transistor TR, and the drain region DR may correspond to a drain electrode of the connection transistor TR.

As illustrated in FIG. 5A, the conductive patterns may include the source electrode pattern W1 and a drain electrode pattern W2, and the source electrode pattern W1 and the drain electrode pattern W2 may be connected to the source region SR and the drain region DR, respectively. The source electrode pattern W1 and the source region SR of the semiconductor pattern SP may function as a source of the connection transistor TR. The drain electrode pattern W2 and the drain region DR of the semiconductor pattern SP may function as a drain of the connection transistor TR. The source electrode pattern W1 and the drain electrode pattern W2 may each be formed as a single body with one of lines constituting the pixel drivers PC and PC-1 (see, e.g., FIG. 2A and FIG. 2B), and are not limited to any one embodiment.

The gate electrode GE is disposed on the second insulation layer 20. The gate electrode GE may correspond to the gate of the connection transistor TR.

The gate electrode GE may be disposed on the semiconductor pattern SP. However, this is only illustrated. The gate electrode GE may be disposed on a lower side of the semiconductor pattern SP, and is not limited to any one embodiment.

The gate electrode GE may include titanium (Ti), silver (Ag), molybdenum (Mo), aluminum (Al), tungsten (W), copper (Cu), or an alloy thereof, or an aluminum nitride (AlNx), a tungsten nitride (WNx), or the like, but is not limited thereto.

A first capacitor electrode CPE1 and a second capacitor electrode CPE2 among conductive patterns W1, W2, CPE1, CPE2, and CPE3 constitute a first capacitor C1. The first capacitor electrode CPE1 and the second capacitor electrode CPE2 may be spaced apart from each other with the first insulation layer 10 and the second insulation layer 20 interposed therebetween.

In an embodiment of the disclosure, the first capacitor electrode CPE1 and the lower conductive layer BML may have a shape of a single body. In addition, the second capacitor electrode CPE2 and the gate electrode GE may have a shape of a single body.

On the third insulation layer 30, a third capacitor electrode CPE3 may be disposed. The third capacitor electrode CPE3 may be spaced apart from the second capacitor electrode CPE2 with the third insulation layer 30 interposed therebetween, and may overlap the same. The third capacitor electrode CPE3 and the second capacitor electrode CPE2 may constitute a second capacitor C2.

On the third capacitor electrode CPE3, the fourth insulation layer 40 may be disposed.

The source electrode pattern W1 and the drain electrode pattern W2 (or, a connection electrode) among conductive patterns W1, W2, CPE1, CPE2, and CPE3 may be disposed on the fourth insulation layer 40. The source electrode pattern W1 may be connected to the source region SR of the semiconductor pattern SP through a first contact-hole CNT1. The drain electrode pattern W2 may be connected to the drain region DR of the semiconductor pattern SP through a second contact-hole CNT2.

On the source electrode pattern W1 and the drain electrode pattern W2, the fifth insulation layer 50 may be disposed.

On the fifth insulation layer 50, the connection line CN is disposed. The connection line CN connects the connection transistor TR and the light emitting element LD. The connection line CN may be a connection node for connecting the pixel driver PC and the light emitting element LD. Meanwhile, this is described, and as long as the connection line CN can be connected to the light emitting element LD, the connection line CN may be defined as a connection node with various elements among elements constituting the pixel driver PC according to a design of the pixel driver PC, and is not limited to any one embodiment.

The sixth insulation layer 60 may be disposed on the fifth insulation layer 50. The sixth insulation layer 60 covers the connection line CN. The fifth insulation layer 50 and the sixth insulation layer 60 may each be an organic layer. For example, the fifth insulation layer 50 and the sixth insulation layer 60 may each include a general purpose polymer such as benzocyclobutene (BCB), polyimide, hexamethyldisiloxane (HMDSO), polymethylmethacrylate (PMMA) and polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, a blend thereof, or the like.

The sixth insulation layer 60 may be provided with a through-hole which exposes at least a portion of the connection line CN. The connection line CN may be electrically connected to an electrode of the light emitting element LD through the portion exposed from the sixth insulation layer 60. That is, the connection line CN connects the connection transistor TR and the light emitting element LD.

The connection line CN may include the driving connector CD and the light emitting connector CE. For ease of description, FIG. 5A illustrates the driving connector CD and the light emitting connector CE, and the other portion of the connection line CN which connects the driving connector CD and the light emitting connector CE are omitted from FIG. 5A.

The driving connector CD may be a portion of the connection line CN that is connected to the pixel driver PC, and may be a portion substantially connected to the connection transistor TR. In the embodiment, the driving connector CD may pass through the fifth insulation layer 50 through a contact hole CNT3 and may be electrically connected to the drain region DR of the semiconductor pattern SP through the drain electrode pattern W2 of the transistor TR.

The light emitting connector CE may be a portion of the connection line CN that is connected to the light emitting element LD. The light emitting connector CE may be defined in a region exposed from the sixth insulation layer 60, and may be a portion to which the second electrode EL2 is directly connected.

The connection line CN may have a multi-layered structure in which a portion thereof includes different materials (e.g., metals). At one end of the connection line CN, the first tip portion TIP1 may be defined. A detailed description thereof will be followed.

On the sixth insulation layer 60, a pixel definition layer PDL and a light emitting element LD may be disposed. In the display panel according to an embodiment of the disclosure, the sixth insulation layer 60 may be omitted, or be provided in plurality, and is not limited to any one embodiment.

The pixel definition layer PDL may be an organic layer. For example, the pixel definition layer PDL may include a general purpose polymer such as benzocyclobutene (BCB), polyimide (PI), hexamethyldisiloxane (HMDSO), polymethylmethacrylate (PMMA) and polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, a blend thereof, or the like.

In an embodiment, the pixel definition layer PDL may have light absorption properties or light blocking properties, and for example, the pixel definition layer PDL may have a black color. The pixel definition layer PDL may include a black coloring agent. The black coloring agent may include at least one of a black dye and a black pigment. The black coloring agent may include carbon black, or a metal such as chromium or an oxide thereof. The pixel definition layer PDL may correspond to a light blocking pattern having light blocking properties.

In the pixel definition layer PDL, the light emitting opening OP-E may be defined. The light emitting opening OP-E may be provided in plurality and be disposed corresponding to each light emitting element. The light emitting opening OP-E may overlap all constituent elements of the light emitting element LD, and may be substantially a region in which light emitted by the light emitting element LD is displayed. Accordingly, the shape of the above-described light emitting portion EP (see, e.g., FIG. 3A) may substantially correspond to the shape of the light emitting opening OP-E on a plane.

In the embodiment, in the sixth insulation layer 60, a first contact opening OP-C1 exposing a portion of an end of the connection line CN may be defined, and in the pixel definition layer PDL, a second contact opening OP-C2 corresponding to the first contact opening OP-C1 and spaced apart from the light emitting opening OP-E may be defined. By exposing a portion of the connection line CN, the first contact opening OP-C1 may provide a portion in which the light emitting element LD may be connected to the connection line CN.

According to the disclosure, in the pixel definition layer PDL, the partition opening pattern OPP-D may be defined. The partition opening pattern OPP-D may be formed by penetrating the pixel definition layer PDL in the thickness direction (i.e. the third direction DR3). The partition opening pattern OPP-D may correspond to a groove GV defined in the sixth insulation layer 60, and the groove GV may extend from the partition opening pattern OPP-D.

A portion of the pixel definition layer PDL may protrude from an edge of the sixth insulation layer 60 defining the groove GV toward the inside of the partition opening pattern OPP-D. Specifically, on a cross-section viewed from an extension direction of the partition opening pattern OPP-D, an inner edge of the pixel definition layer PDL defining the partition opening pattern OPP-D may protrude from an edge of the groove GV defined on the sixth insulation layer 60 toward the center of the partition opening pattern OPP-D. Accordingly, a second tip portion TIP2 may be defined on the inner edge of the pixel definition layer PDL defining the partition opening pattern OPP-D. A detailed description thereof will be followed.

The light emitting element LD may include a first electrode EL1, a middle layer ML, and a second electrode EL2. The first electrode EL1 may be a transflective, transmissive, or reflective electrode. According to an embodiment of the disclosure, the first electrode EL1 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), a compound thereof, or the like, and a transparent or translucent electrode layer formed on the reflective layer. The transparent or translucent electrode layer may include or be provided with at least one selected from the group consisting of an indium tin oxide (ITO), an indium zinc oxide (IZO), an indium gallium zinc oxide (IGZO), a zinc oxide (ZnO), or an indium oxide (In2O3), and an aluminum-doped zinc oxide (AZO). For example, the first electrode EL1 may include a laminated structure of ITO/Ag/ITO.

In the embodiment, the first electrode EL1 may be the anode of the light emitting element LD. The first electrode EL1 of FIG. 5A may correspond to one of the anodes EL1_1, EL1_2, and EL1_3 of FIG. 4A.

The first electrode EL1 may be connected to the first driving voltage line VDL (see, e.g., FIG. 2A) and may receive the first power voltage VDD (see, e.g., FIG. 2A). The first electrode EL1 may be connected to the first driving voltage line VDL (see, e.g., FIG. 2A) in the display region DA (see, e.g., FIG. 3A), or may be connected to the first driving voltage line VDL (see, e.g., FIG. 2A) in the peripheral region NDA (see, e.g., FIG. 3A). In the latter case, the first driving voltage line VDL (see, e.g., FIG. 2A) may be disposed in the peripheral region NDA (see, e.g., FIG. 3A), and the first electrode EL1 may have a shape extended to the peripheral region NDA (see, e.g., FIG. 3A).

The first electrodes EL1 of light emitting elements LD may be disposed spaced apart from each other on the sixth insulation layer 60, but the first electrodes EL1 may be electrically connected to each other through separate conductive patterns disposed on a lower side of the sixth insulation layer 60. The first electrodes EL1 may be connected to the separate conductive patterns through a contact-hole. Therefore, substantially the same first power voltage VDD (see, e.g., FIG. 2A) may be applied to the first electrodes EL1 of the light emitting elements LD, and a common voltage may be provided to the light emitting portions EP1, EP2, and EP3 (see, e.g., FIG. 4A).

The middle layer ML may be disposed between the first electrode EL1 and the second electrode EL2. In the embodiment, the middle layer ML may include a light emitting layer EML and a functional layer FNL. However, this is illustrated as an example, and the light emitting element LD may include the middle layer ML of various structures, and is not limited to any one embodiment. For example, the functional layer FNL may be provided as multiple layers, or may be provided as two or more layers spaced apart from each other with the light emitting layer EML interposed therebetween. As another example, in an embodiment of the disclosure, the functional layer FNL may be omitted.

The light emitting layer EML may emit light by absorbing energy corresponding to a potential difference between the first electrode EL1 and the second electrode EL2. Although the light emitting layer EML is illustrated as an embodiment including an organic light emitting material, the embodiment of the disclosure is not limited thereto, and the light emitting layer EML may include an inorganic light emitting material or may be provided as a mixed layer of an organic light emitting material and an inorganic light emitting material.

The light emitting layer EML may be disposed overlapping the light emitting opening OP-E. In the embodiment, the light emitting layer EML may be divided and formed in each pixel. In case that the light emitting layer EML is divided and formed in each of the light emitting portions EP (see, e.g., FIG. 3A), the light emitting layer EML may emit light of at least any one color of blue, red, and green. However, the embodiment of the disclosure is not limited thereto, and the light emitting layer EML may have a shape of a single body commonly provided to adjacent light emitting portions EP (see, e.g., FIG. 3A). In this case, the light emitting layer EML may provide blue light, or may provide white light. The light emitting layer EML may have substantially the same shape as that of the functional layer FNL, and may be provided as the middle layer ML having a shape of a single body without limitation on a layer boundary with the functional layer FNL.

The functional layer FNL is disposed between the first electrode EL1 and the second electrode EL2. Specifically, the functional layer FNL may be disposed between the first electrode EL1 and the light emitting layer EML, or be disposed between the second electrode EL2 and the light emitting layer EML. As another example, the functional layer FNL may be disposed between the first electrode EL1 and the light emitting layer EML and between the second electrode EL2 and the light emitting layer EML. In the embodiment, the light emitting layer EML is illustrated as being inserted into the functional layer FNL. However, this is illustrated as an example, and the functional layer FNL may include a layer disposed between the light emitting layer EML and the first electrode EL1, and/or a layer disposed between the light emitting layer EML and the second electrode EL2, and may be provided in plurality, but is not limited to any one embodiment.

The functional layer FNL may control the movement of charges. The functional layer FNL may include a hole injection/transport material and/or an electron injection/transport material. The functional layer FNL may include at least one of an electron blocking layer, a hole transport layer, a hole injection layer, a hole blocking layer, an electron transport layer, an electron injection layer, and a charge generation layer.

The second electrode EL2 may be disposed on the middle layer ML. The second electrode EL2 may be the cathode of the light emitting element LD. The second electrode EL2 in FIG. 5A may correspond to one of the cathodes EL2_1, EL2_2, and EL2_3 in FIG. 4B. As described above, the second electrode EL2 may be connected to the pixel driver PC through the fourth node N4 of FIG. 2A or the second node N2 of FIG. 2B. In the embodiment, the second electrode EL2 may be electrically connected to the connection transistor TR through the connection line CN.

The middle layer ML and the second electrode EL2 may each be commonly formed in the pixels PXij (see, e.g., FIG. 1) by using an open mask. The middle layer ML and the second electrode EL2 may be divided for each pixel by the second tip portion TIP2 defined in the pixel definition layer PDL through the partition opening pattern OPP-D and the groove GV. The partition opening pattern OPP-D may have a closed-line shape for each of the light emitting portions EP1, EP2, and EP3 (see, e.g., FIG. 4A) on a plane so as to be independent of each of the light emitting portions EP1, EP2, and EP3 (see, e.g., FIG. 4A), and accordingly, the second electrode EL2 may have a shape divided for each of the light emitting portions EP1, EP2, and EP3 (see, e.g., FIG. 4A). For example, the second electrode EL2 may be electrically independent of each of the adjacent pixels PXij (see, e.g., FIG. 1).

Partition patterns UP1 and UP2 may be disposed in the groove GV. The partition patterns UP1 and UP2 may include a first partition pattern UP1 and a second partition pattern UP2.

The first partition pattern UP1 may include the same material as that of the middle layer ML. For example, in case that the middle layer ML is commonly formed, the first partition pattern UP1 may correspond to a residue separated from the middle layer ML by the second tip portion TIP2 defined in the pixel definition layer PDL. The second partition pattern UP2 may include the same material as that of the second electrode EL2. For example, in case that the second electrode EL2 is commonly formed, the second partition pattern UP2 may correspond to a residue separated from the second electrode EL2 by the second tip portion TIP2 defined in the pixel definition layer PDL. In the embodiment, the shape of each of the first and second partition patterns UP1 and UP2 on a plane may be substantially the same as the shape of the groove GV on a plane.

Hereinafter, referring to FIG. 5B, the structure/shape of the connection line CN and the connection form between the second electrode EL2 and the connection line CN will be described in detail.

The connection line CN may have conductivity, and may be configured in a three-layered structure. The connection line CN may include a first layer F1, a second layer F2, and a third layer F3 which are sequentially laminated in a third direction DR3.

Each of the first and third layers F1 and F3 may be relatively thin compared to the second layer F2. The first and third layers F1 and F3 may include the same material as each other, and the second layer F2 may include a material different from that of each of the first and third layers F1 and F3. The etch rate of the second layer F2 may be greater than the etch rate of each of the first and third layers F1 and F3. For example, the second layer F2 may include a material having a high etch selection ratio with respect to each of the first and third layers F1 and F3. For example, each of the first and third layers F1 and F3 may include titanium (Ti), and the second layer F2 may include aluminum (Al). However, materials of the first to third layers F1, F2, and F3 are not limited to any one embodiment.

An edge of the second layer F2 adjacent to the second electrode EL2 may be disposed relatively further inside of the connection line CN than an edge of each of the first and third layers F1 and F3. For example, each of the edge of the first layer F1 and the edge of the third layer F3 may be further protruded than the edge of the second layer F2. A portion of the third layer F3 further protruded than the second layer F2 may be defined as the first tip portion TIP1.

In the sixth insulation layer 60, the first contact opening OP-C1, which exposes an end portion of the connection line CN in which the first tip portion TIP1 is defined, may be defined. The first contact opening OP-C1 is formed through an etching process of the sixth insulation layer 60.

In an embodiment, the width of the first contact opening OP-C1 may decrease as the first contact opening OP-C1 is closer to the sixth insulation layer 60. However, the embodiment of the disclosure is not limited thereto, and depending on process conditions and/or materials of the sixth insulation layer 60, the width of the first contact opening OP-C1 may be constant.

In an embodiment, a side surface of the sixth insulation layer 60 defining the first contact opening OP-C1 may have a concave shape in a direction toward the inside of the sixth insulation layer 60. However, the embodiment of the disclosure is not limited thereto, and depending on process conditions and/or materials of the sixth insulation layer 60, the shape of the side surface of the sixth insulation layer 60 defining the first contact opening OP-C1 may change.

In the embodiment, the etch rate of the sixth insulation layer 60 may be greater than the etch rate of the fifth insulation layer 50. For example, the sixth insulation layer 60 may include a material having a high etch selection ratio with respect to the fifth insulation layer 50. Accordingly, in performing an etching process of forming an opening in the sixth insulation layer 60, it is possible to prevent lower components of the sixth insulation layer 60 from being removed. For example, the sixth insulation layer 60 may include photosensitive polyimide, and the fifth insulation layer 50 may include siloxane. However, materials of the sixth insulation layer 60 and the fifth insulation layer 50 are not limited to any one embodiment.

In an embodiment, during the etching process of the sixth insulation layer 60, a portion of the fifth insulation layer 50 may be removed together with the sixth insulation layer 60 in the thickness direction. Accordingly, in the fifth insulation layer 50, a recessed portion DPP recessed in a direction away from the sixth insulation layer 60 may be defined. The recessed portion DPP may overlap the first contact opening OP-C1 and may not overlap the connection line CN. For example, the recessed portion DPP may be a region of the fifth insulation layer 50 that is not in contact with the connection line CN and is exposed from the sixth insulation layer 60 by the first contact opening OP-C1.

In addition, during the etching process of the sixth insulation layer 60, a portion of the third layer F3 of the connection line CN may be removed together with the sixth insulation layer 60 in the thickness direction. Accordingly, a thickness t1 of the third layer F3 overlapping the first contact opening OP-C1 may be less than a thickness t2 of the third layer F3 not overlapping the first contact opening OP-C1.

In the pixel definition layer PDL, the second contact opening OP-C2 corresponding to the first contact opening OP-C1 and spaced apart from the light emitting opening OP-E may be defined. A width of the second contact opening OP-C2 may be greater than a width of the first contact opening OP-C1. A planar area of the second contact opening OP-C2 may be greater than a planar area of the first contact opening OP-C1. An upper surface of the sixth insulation layer 60 overlapping the second contact opening OP-C2 may be exposed by the pixel definition layer PDL. However, the embodiment of the disclosure is not limited thereto, and the width of the second contact opening OP-C2 may be substantially the same as the width of the first contact opening OP-C1. The planar area of the second contact opening OP-C2 may be substantially the same as the planar area of the first contact opening OP-C1. In the embodiment, the second contact opening OP-C2 of the pixel definition layer PDL may be formed through a photolithography process.

In an embodiment, the width of the second contact opening OP-C2 may decrease as the second contact opening OP-C2 is closer to the sixth insulation layer 60. However, the embodiment of the disclosure is not limited thereto, and depending on process conditions and/or materials of the pixel definition layer PDL, the width of the second contact opening OP-C2 may be constant.

In an embodiment, a side surface of the pixel definition layer PDL defining the second contact opening OP-C2 may have a convex shape in a direction toward the second contact opening OP-C2. However, the embodiment of the disclosure is not limited thereto, and depending on process conditions and/or materials of the pixel definition layer PDL, the shape of the side surface of the pixel definition layer PDL defining the second contact opening OP-C2 may change.

The middle layer ML may be disposed in the first and second contact openings OP-C1 and OP-C2. The middle layer ML may be in contact with a side surface SS-UIL of the sixth insulation layer 60 defining the first contact opening OP-C1, and may cover all of the side surface SS-UIL of the sixth insulation layer 60 defining the first contact opening OP-C1. The middle layer ML may be in contact with the side surface of the pixel definition layer PDL defining the second contact opening OP-C2, and may cover all of the side surface of the pixel definition layer PDL defining the second contact opening OP-C2. The middle layer ML may be in contact with the upper surface of the fifth insulation layer 50 defining the recessed portion DPP, and may cover all of the upper surface of the fifth insulation layer 50 defining the recessed portion DPP.

In addition, the middle layer ML may cover the third layer F3 overlapping the first contact opening OP-C1 and at least a portion of the first layer F1 protruding from the edge of the second layer F2. The middle layer ML covering the third layer F3 may be cut into two portions with respect to the first tip portion TIP1. One end portion of the middle layer ML is disposed on the first tip portion TIP1, and one end of the middle layer ML may be in contact with an end of the third layer F3. The other end portion of the middle layer ML may be formed along the upper surface of the fifth insulation layer 50, and the other end of the middle layer ML may be in contact with a side surface SS-F2 of the exposed second layer F2. However, the embodiment of the disclosure is not limited thereto, and the middle layer ML may not be in contact with the side surface SS-F2 of the second layer F2.

The second electrode EL2 may be disposed on the middle layer ML in the first and second contact openings OP-C1 and OP-C2. The second electrode EL2 may be disposed on the third layer F3 overlapping the first contact opening OP-C1 and on the first layer F1 protruding from the edge of the second layer F2. The second electrode EL2 may also be cut into two portions with respect to the first tip portion TIP1. One end portion of the second electrode EL2 may be disposed on the first tip portion TIP1. A portion of the second electrode EL2 may be formed along the upper surface of the fifth insulation layer 50, and another end of the second electrode EL2 may be in contact with the side surface SS-F2 of the exposed second layer F2.

The second electrode EL2 may be in contact with a portion of a side surface SS-F2 of the second layer F2 that is not in contact with the middle layer ML. In other words, the second electrode EL2 may be connected to the exposed one end portion of the connection line CN, through which the second electrode EL2 may be electrically connected to the connection line CN. In an embodiment, the second electrode EL2 may cover the entire portion of the side surface SS-F2 of the second layer F2 that is not in contact with the middle layer ML. This reduces an area as much as possible in which the middle layer ML is in contact with the side surface SS-F2 of the second layer F2 while being disconnected by the first tip portion TIP1 through a difference in deposition angle, and may increase an area as much as possible in which the second electrode EL2 is in contact with the side surface SS-F2 of the second layer F2. Therefore, in the light emitting connector CE, the degree of intervention of the middle layer ML may be reduced, and the connection between the second electrode EL2 and the second layer F2 may be facilitated. Therefore, the second electrode EL2 may be stably connected to the connection line CN while being separated for each pixel without a separate patterning process. However, the embodiment of the disclosure is not limited thereto, and a portion of the side surface SS-F2 of the second layer F2 may not be in contact with the second electrode EL2 and the middle layer ML.

Hereinafter, referring to FIG. 5C, the partition opening pattern OPP-D of the pixel definition layer PDL and the groove GV of the sixth insulation layer 60 will be described in detail.

In the embodiment, the partition opening pattern OPP-D and the groove GV may be formed through an etching process of the pixel definition layer PDL and the sixth insulation layer 60. The pixel definition layer PDL and the sixth insulation layer 60 may be etched to simultaneously form the partition opening pattern OPP-D and the groove GV. Therefore, the groove GV may be formed extended from the partition opening pattern OPP-D.

On a cross-section viewed from the extension direction of the partition opening pattern OPP-D, a width of the partition opening pattern OPP-D may decrease as the partition opening pattern OPP-D is closer to the groove GV in the thickness direction. On a cross-section viewed from an extension direction of the groove GV, a width of the groove GV may decrease as the groove GV is farther from the partition opening pattern OPP-D in the thickness direction. However, the embodiment of the disclosure is not limited thereto, and depending on process conditions and/or materials of the pixel definition layer PDL and the sixth insulation layer 60, the width of the partition opening pattern OPP-D and the width of the groove GV may be, for example, constant.

A side surface SS-D of the pixel definition layer PDL defining the partition opening pattern OPP-D may have a concave shape in a direction toward the inside of the pixel definition layer PDL. A side surface of the sixth insulation layer 60 defining the groove GV may have a concave shape in a direction toward the inside of the sixth insulation layer 60. However, the embodiment of the disclosure is not limited thereto, and depending on process conditions and/or materials of the pixel definition layer PDL and the sixth insulation layer 60, the shape of the side surface SS-D of the pixel definition layer PDL and the shape of the side surface of the sixth insulation 60 may change.

The etch rate of the sixth insulation layer 60 may be greater than the etch rate of the pixel definition layer PDL. For example, the sixth insulation layer 60 may include a material having a high etch selection ratio with respect to the pixel definition layer PDL. In an embodiment, the pixel definition layer PDL and the fifth insulation layer 50 may include the different material from each other. For example, the sixth insulation layer 60 may include photosensitive polyimide, and the pixel definition layer PDL may include siloxane. However, materials of the sixth insulation layer 60 and the pixel definition layer PDL are not limited to any one embodiment.

Accordingly, the width of the sixth insulation layer 60 removed from a portion adjacent to the pixel definition layer PDL during the etching process may be greater than the width of the pixel definition layer PDL removed from a portion adjacent to the sixth insulation layer 60. A minimum width w1 on a cross-section of the partition opening pattern OPP-D may be less than a maximum width w2 on a cross-section of the groove GV. In the embodiment, the minimum width w1 of the partition opening pattern OPP-D may be defined at an inner edge connected to a lower surface LS-D of the side surface SS-D of the pixel definition layer PDL, and the maximum width w2 of the groove GV may be defined at an inner edge connected to an upper surface of the side surface of the sixth insulation layer 60.

Therefore, according to the disclosure, the lower surface LS-D connected to (or extended to) the side surface SS-D of the pixel definition layer PDL overlapping the groove GV and defining the partition opening pattern OPP-D may be exposed from the sixth insulation layer 60 by the groove GV. For example, on a cross-section viewed from the extension direction of the partition opening pattern OPP-D, the inner edge of the pixel definition layer PDL defining the partition opening pattern OPP-D may protrude from the sixth insulation layer 60 toward the center of the groove GV.

The side surface SS-D of the pixel definition layer PDL defining the partition opening pattern OPP-D, the lower surface LS-D of the pixel definition layer PDL protruding from the sixth insulation layer 60, and the groove GV of the sixth insulation layer 60 may define the second tip portion TIP2.

Unlike the disclosure, in case that a separate partition structure having a reverse tapered shape is included without including an insulation film having a tip portion defined thereon, it is possible to determine whether the middle layer ML and the second electrode EL2 are disconnected according to a reverse taper angle of the partition structure. In case that a process deviation of the reverse taper angle of the partition structure is high, a disconnection failure of the second electrode EL2 may occur.

On the other hand, according to the disclosure, the second electrode EL2 may be disconnected by an inner edge of the pixel definition layer PDL exposed by the sixth insulation layer 60. For example, in case that a groove GV having a width greater than the width of the partition opening pattern OPP-D may be formed near the boundary between the partition opening pattern OPP-D and the groove GV through a simultaneous etching process of the pixel definition layer PDL and the sixth insulation layer 60 including a material having a high etching selection ratio, the second electrode EL2 may be disconnected even if the taper angle and the like of the side surface SS-D of the pixel definition layer PDL or the side surface of the sixth insulation layer 60 are not controlled. Therefore, since a process variation may be relatively low, it is possible to prevent a defective pixel from being provided.

FIG. 6 illustrates a schematic plan view of an enlarged portion of the pixel definition layer PDL. For convenience of description, the first contact openings OP-C1 of the sixth insulation layer 60 (see, e.g., FIG. 5A) are illustrated together. In FIG. 6, a portion of the pixel definition layer PDL removed in the thickness direction is marked in bold by hatching and darkening. Hereinafter, referring to FIG. 4B and FIG. 6 together, the shape of the pixel definition layer PDL on a plane will be described in detail.

The partition opening pattern OPP-D of the pixel definition layer PDL may partition regions AA1, AA2, and AA3, and each of the regions AA1, AA2, and AA3 may be substantially the same as a region in which a corresponding second electrode among the second electrodes EL2_1, EL2_2, and EL2_3 is disposed.

The groove GV of the sixth insulation layer 60 described above with reference to FIG. 5A and FIG. 5C may be disposed corresponding to the partition opening pattern OPP-D, and the shape of the groove GV on a plane may correspond to the shape of the partition opening pattern OPP-D on a plane.

Light emitting openings OP-E1, OP-E2, and OP-E3 of the pixel definition layer PDL may include a first light emitting opening OP-E1, a second light emitting opening OP-E2, and a third light emitting opening OP-E3. As described above, the shapes of the first to third light emitting openings OP-E1, OP-E2, and OP-E3 on a plane (or in a plan view) may substantially correspond to the shapes of the first to third light emitting portions EP1, EP2, and EP3, respectively.

In an embodiment, the third light emitting openings OP-E3 may include two sub-light emitting openings OP-E31 and OP-E32 spaced apart from each other in the second direction DR2. The shapes of the two sub-light emitting openings OP-E31 and OP-E32 on the plane may substantially correspond to the shapes of the two sub-light emitting portions EP31 and EP32, respectively.

The first contact openings OP-C1 of the sixth insulation layer 60 may include first sub-openings OP-C11, second sub-openings OP-C12, and third sub-openings OP-C13. The first sub-openings OP-C11 may respectively correspond to the first light emitting connectors CE1, the second sub-openings OP-C12 may respectively correspond to the second light emitting connectors CE2, and the third sub-openings OP-C13 may respectively correspond to the third light emitting connectors CE3.

The second contact openings OP-C2 of the pixel definition layer PDL may include fourth sub-openings OP-C21, fifth sub-openings OP-C22, and sixth sub-openings OP-C23. The fourth sub-openings OP-C21 may respectively correspond to the first sub-openings OP-C11, the fifth sub-openings OP-C22 may respectively correspond to the second sub-openings OP-C12, and the sixth sub-openings OP-C23 may respectively correspond to the third sub-openings OP-C13.

In the embodiment, the region AA1, AA2, and AA3 defined by the partition opening pattern OPP-D may include a first region AA1, a second region AA2, and a third region AA3.

The first region AA1 may be substantially the same as a region in which the first cathode EL2_1 is disposed. The first region AA1 may be a region in which a light emitting element for forming the first light emitting portion EP1 is disposed. In the first region AA1, the first light emitting opening OP-E1 and the fourth sub-opening OP-C21 may be disposed. That is, the first light emitting opening OP-E1 may be entirely surrounded by the partition opening pattern OPP-D, and the fourth sub-opening OP-C21 may be entirely surrounded by the partition opening pattern OPP-D.

The second region AA2 may be substantially the same as a region in which the second cathode EL2_2 is disposed. The second region AA2 may be a region in which a light emitting element for forming the second light emitting portion EP2 is disposed. In the second region AA2, the second light emitting opening OP-E2 and the fifth sub-opening OP-C22 may be disposed. For example, the second light emitting opening OP-E2 may be entirely surrounded by the partition opening pattern OPP-D, and the fifth sub-opening OP-C22 may be entirely surrounded by the partition opening pattern OPP-D.

The third region AA3 may be substantially the same as a region in which the third cathode EL2_3 is disposed. The third region AA3 may be a region in which a light emitting element for forming the third light emitting portion EP3 is disposed. In the third region AA3, the third light emitting opening OP-E3 and the sixth sub-opening OP-C23 may be disposed. For example, the third light emitting opening OP-E3 may be entirely surrounded by the partition opening pattern OPP-D, and the sixth sub-opening OP-C23 may be entirely surrounded by the partition opening pattern OPP-D.

Figure 7:
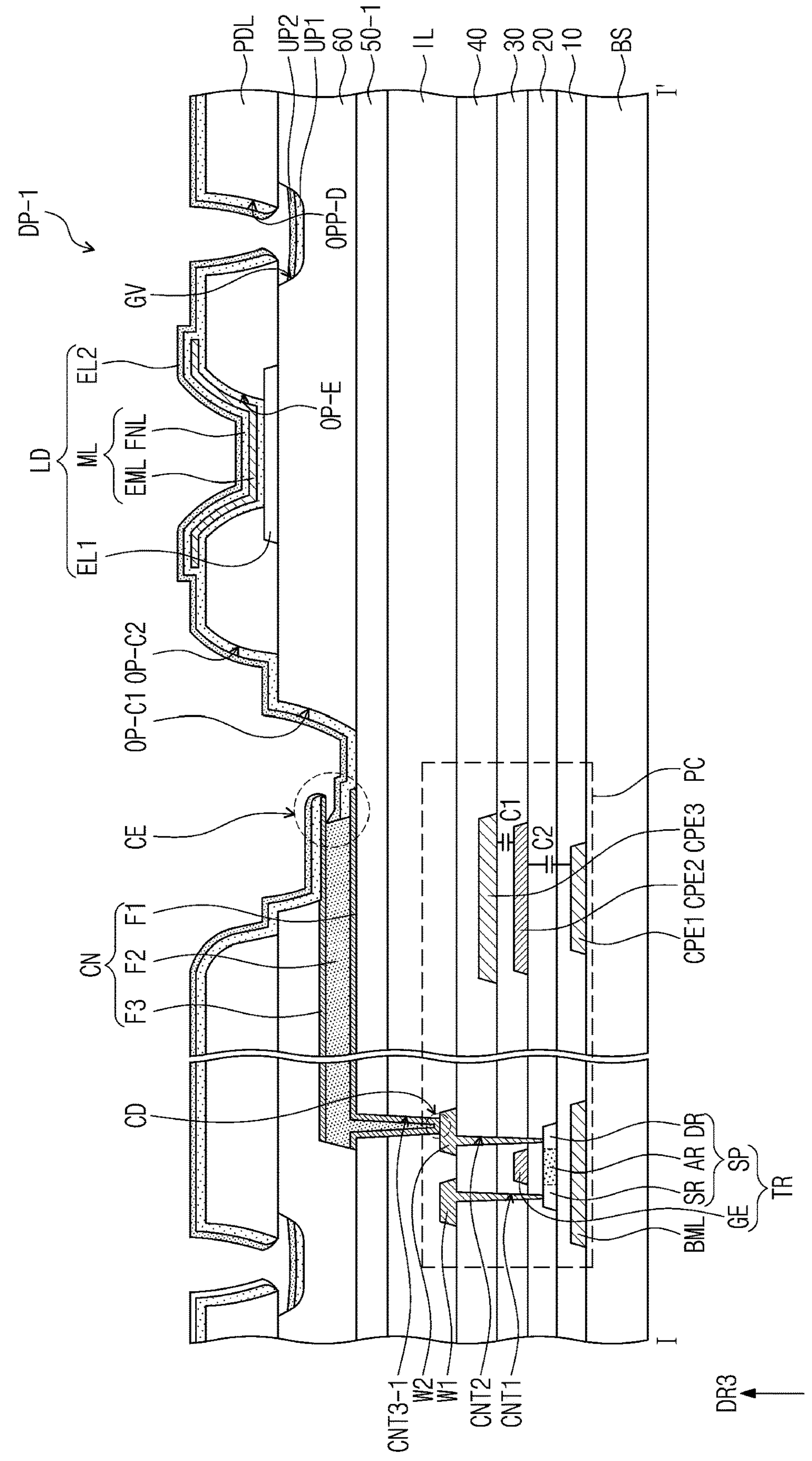
FIG. 7 is a schematic cross-sectional view taken along line I-I' of FIG. 4B of some enlarged regions of a display panel according to an embodiment of the disclosure.

FIG. 7 is a schematic cross-sectional view taken along line I-I' of FIG. 4B of some enlarged regions of a display panel according to an embodiment of the disclosure.

Referring to FIG. 7, a display panel DP-1 of according to an embodiment of the disclosure may further include an additional insulation layer IL. The additional insulation layer IL may be disposed between the fourth insulation layer 40 and a fifth insulation layer 50-1. The additional insulation layer IL may include an organic insulation material. The additional insulation layer IL may be referred to as an organic insulation layer. For example, the additional insulation layer IL may include a general purpose polymer such as benzocyclobutene (BCB), polyimide (PI), hexamethyldisiloxane (HMDSO), polymethylmethacrylate (PMMA), and polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, a blend thereof, or the like.

In the embodiment, the fifth insulation layer 50-1 may include an inorganic insulation material. For example, the fifth insulation layer 50-1 may include silicon oxide, silicon nitride, silicon oxynitride, a combination thereof, or the like. Since the etch rate of the fifth insulation layer 50-1 according to the embodiment is lower than that of an organic insulation material, the recessed portion DPP described above with reference to FIG. 5B may not be formed in the fifth insulation layer 50-1. As another example, even in case that the recessed portion DPP is formed in the fifth insulation layer 50-1, the degree to which the fifth insulation layer 50-1 is etched and recessed may be lower.

In the embodiment, the connection line CN may be connected to the drain electrode pattern W2 through a third contact-hole CNT3-1 passing through both the fifth insulation layer 50-1 and the additional insulation layer IL to be electrically connected to the drain region DR.

FIG. 8A to FIG. 8F are schematic cross-sectional views showing some of steps of a method for manufacturing a display panel according to an embodiment of the disclosure. The same/similar reference numerals or reference characters are used for the same/similar components as those described with reference to FIG. 1 to FIG. 6, and redundant descriptions thereof are omitted.

Referring to FIG. 8A to FIG. 8F, the method for manufacturing the display panel DP according to an embodiment may include at least one of providing a preliminary display panel DP-I, forming a mask pattern MP, etching a pixel definition layer PDL and a sixth insulation layer 60, forming a tip portion in a connection line CN, removing the mask pattern MP, and forming a middle layer ML and a second electrode EL2.

Figure 8A:
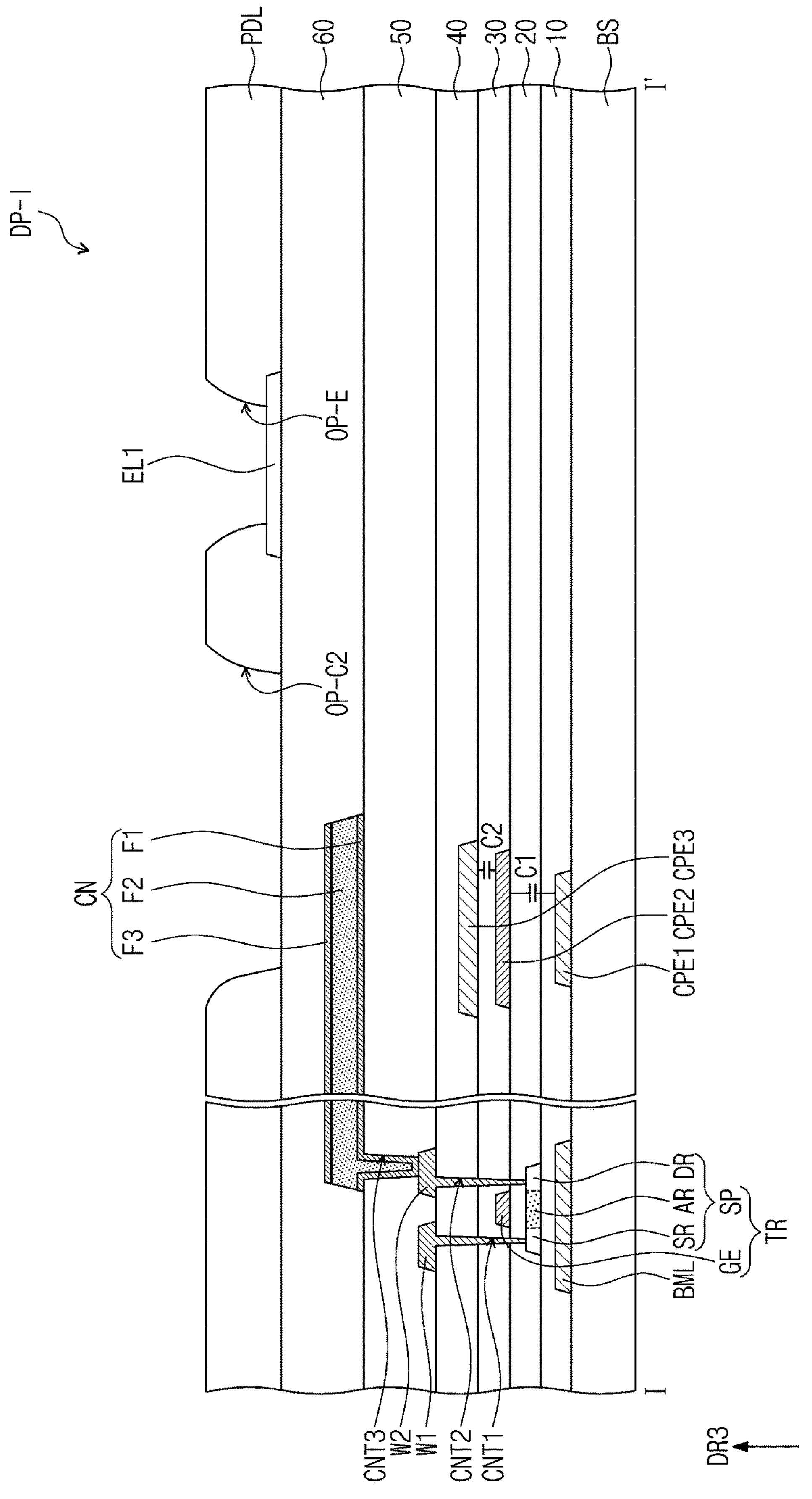
FIG. 8A to FIG. 8F are schematic cross-sectional views showing a method for manufacturing a display panel according to an embodiment of the disclosure.

As illustrated in FIG. 8A, the method for manufacturing a display panel according to an embodiment may include the providing of the preliminary display panel DP-I.

In the embodiment, the preliminary display panel DP-I may include a base layer BS, first to sixth insulation layers 10, 20, 30, 40, 50, and 60 disposed on the base layer BS, a connection transistor TR, conductive patterns CPE1, CPE2, CPE3, W1, and W2, a connection line CN disposed between the fifth and sixth insulation layers 50 and 60, a pixel definition layer PDL disposed on the sixth insulation layer 60, and a first electrode EL1 disposed on the sixth insulation layer 60. The connection line CN may include first to third layers F1, F2, and F3 sequentially disposed in a third direction DR3, and edges of the first to third layers F1, F2, and F3 may be provided in a state of being aligned with each other. The connection line CN may be provided in a state of being covered (e.g., entirely covered) by an upper insulation layer.

The pixel definition layer PDL may be provided in a state in which a light emitting opening OP-E exposing a portion of the first electrode EL1 and a second contact opening OP-C2 overlapping an end portion of the connection line CN are defined. The light emitting opening OP-E and the second contact opening OP-C2 may be formed by patterning the pixel definition layer PDL through a photolithography process.

Figure 8B:
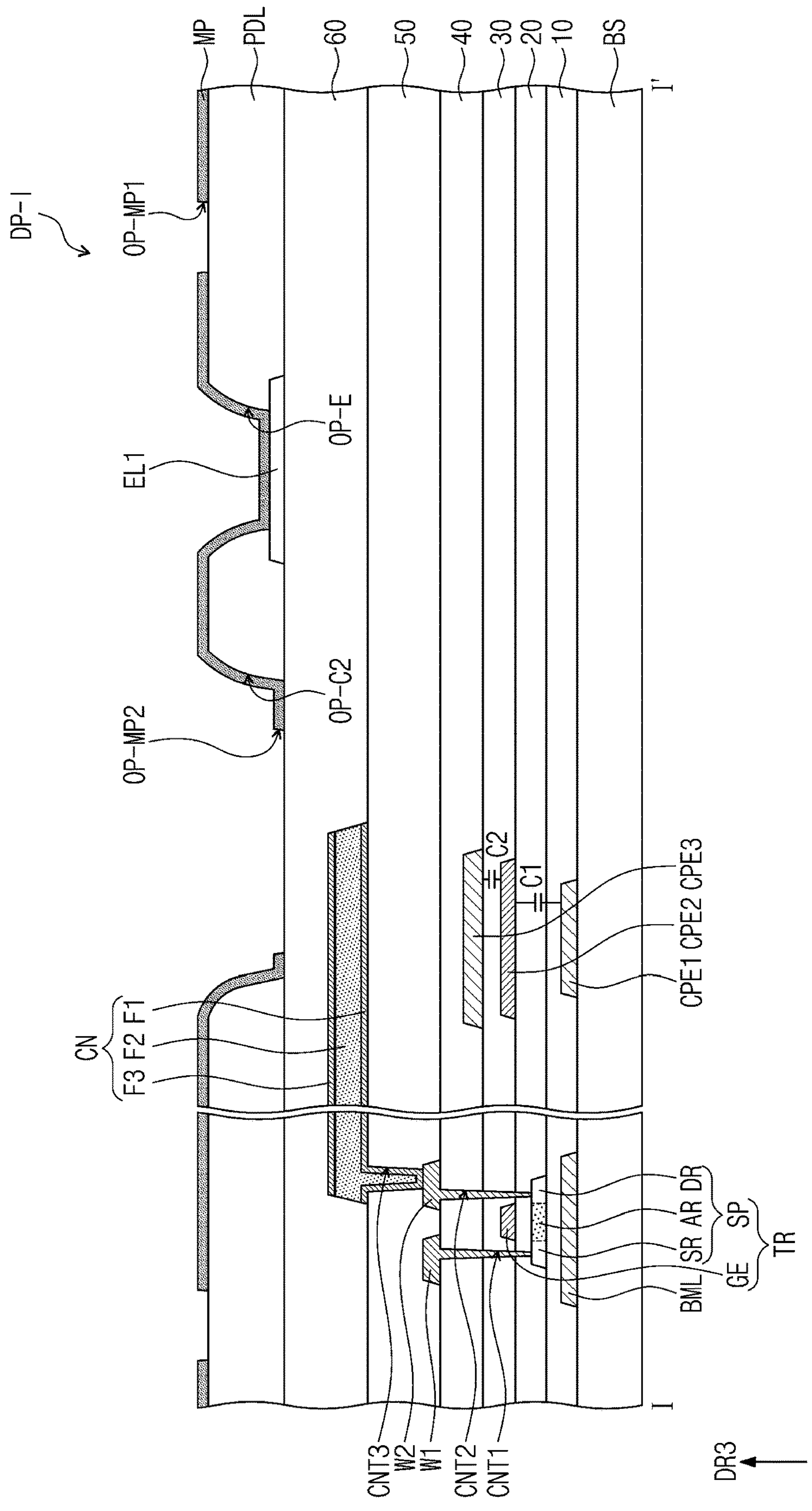

As illustrated in FIG. 8B, the method for manufacturing a display panel according to an embodiment may include the forming of the mask pattern MP. The mask pattern MP may be formed on the pixel definition layer PDL.

In the mask pattern MP, a first mask opening OP-MP1 and a second mask opening OP-MP2 may be formed. The first mask opening OP-MP1 may overlap a partition opening pattern OPP-D (see, e.g., FIG. 8C) to be formed in the pixel definition layer PDL, and the second mask opening OP-MP2 may be disposed in the second contact opening OP-C2 and may overlap a first contact opening OP-C1 (see, e.g., FIG. 8C) to be formed in the sixth insulation layer 60. The first and second mask openings OP-MP1 and OP-MP2 may be formed by patterning the mask pattern MP through a photolithography process.

In an embodiment the mask pattern MP may include a transparent conductive oxide. For example, the mask pattern MP may include or be provided with at least one selected from the group consisting of indium tin oxide (ITO), indium zinc oxide (IZO), indium gallium zinc oxide (IGZO), zinc oxide (ZnO) or indium oxide ($In_2O_3$), and aluminum-doped zinc oxide (AZO).

Figure 8C:
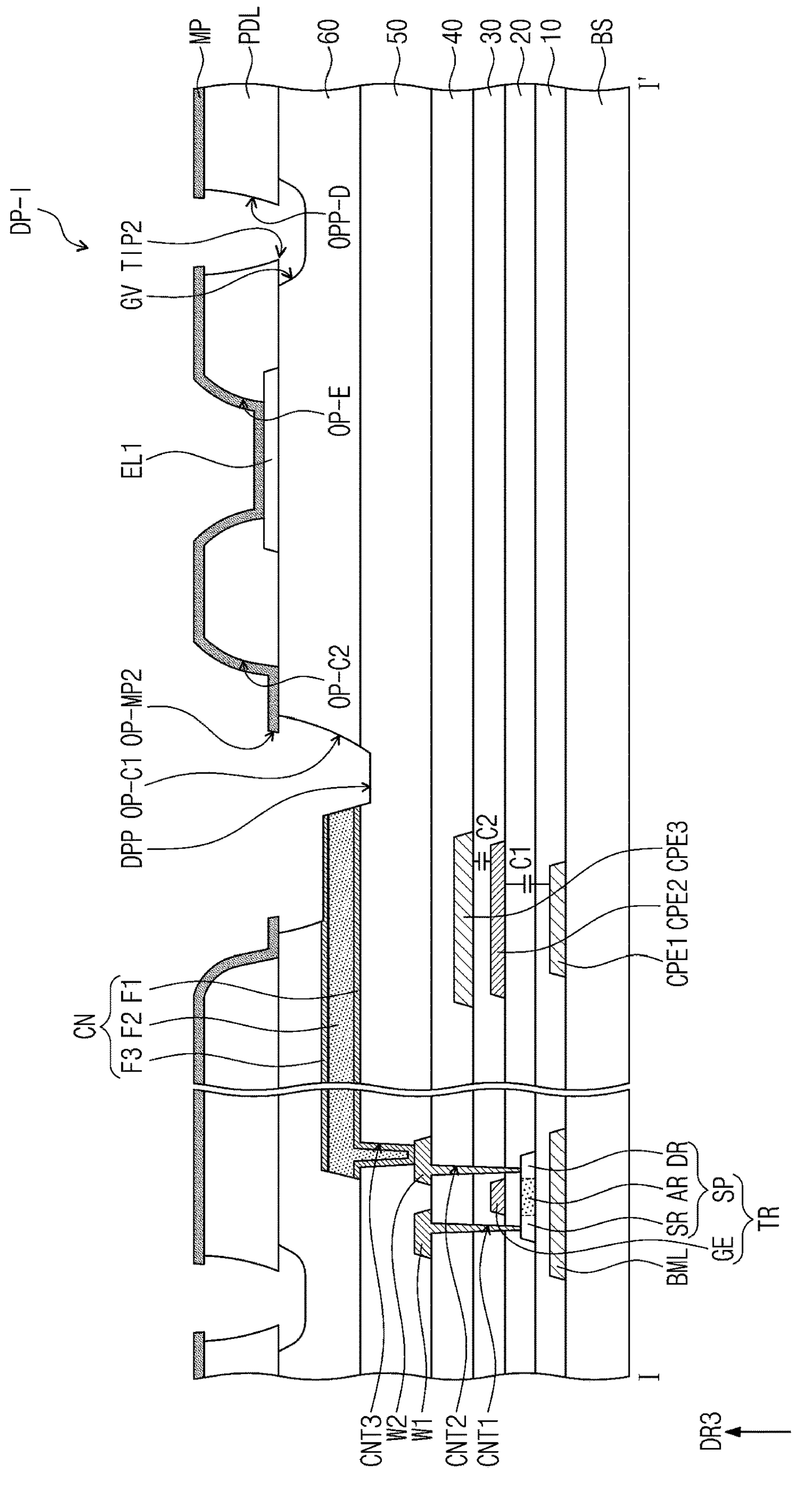

As illustrated in FIG. 8C, the method for manufacturing a display panel according to an embodiment may include the etching of the pixel definition layer PDL and the sixth insulation layer 60. In the embodiment, the etching process may be performed by a dry etching method.

The pixel definition layer PDL exposed from the mask pattern MP by the first mask opening OP-MP1 may be removed by an etching gas, so that the partition opening pattern OPP-D corresponding to the first mask opening OP-MP1 may be formed in the pixel definition layer PDL. By the same process, the sixth insulation layer 60 exposed from the pixel definition layer PDL by the partition opening pattern OPP-D may be removed by an etchant, so that and a groove GV extended from the partition opening pattern OPP-D may be formed in the sixth insulation layer 60.

In the embodiment, the sixth insulation layer 60 may have an etch rate greater than that of the pixel definition layer PDL, so that a portion of a lower surface LS-D (see, e.g., FIG. 5C) connected to a side surface SS-D (see, e.g., FIG. 5C) of the pixel definition layer PDL defining the partition opening pattern OPP-D may overlap the groove GV and be exposed from the sixth insulation layer 60. For example, a second tip portion TIP2 may be formed on an inner edge of the pixel definition layer PDL defining the partition opening pattern OPP-D.

The sixth insulation layer 60 exposed from the mask pattern MP by the second mask opening OP-MP2 may be removed by an etching gas, so that the first contact opening OP-C1 corresponding to the second mask opening OP-MP2 may be formed in the pixel definition layer 60. An end of the connection line CN may be exposed from the sixth insulation layer 60 by the first contact opening OP-C1.

In the embodiment, the fifth insulation layer 50 may have an etch rate lower than the etch rate of the sixth insulation layer 60 to prevent lower components of the sixth insulation layer 60 from being etched. In an embodiment, a portion of the fifth insulation layer 50 may be etched together with the sixth insulation layer 60 in a thickness direction, so that a recessed portion DPP may be formed in the fifth insulation layer 50. That recessed portion DPP may be formed in a portion of the fifth insulation layer 50 that is in contact with the connection line CN and is exposed from the sixth insulation layer 60 by the first contact opening OP-C1.

Figure 8D:
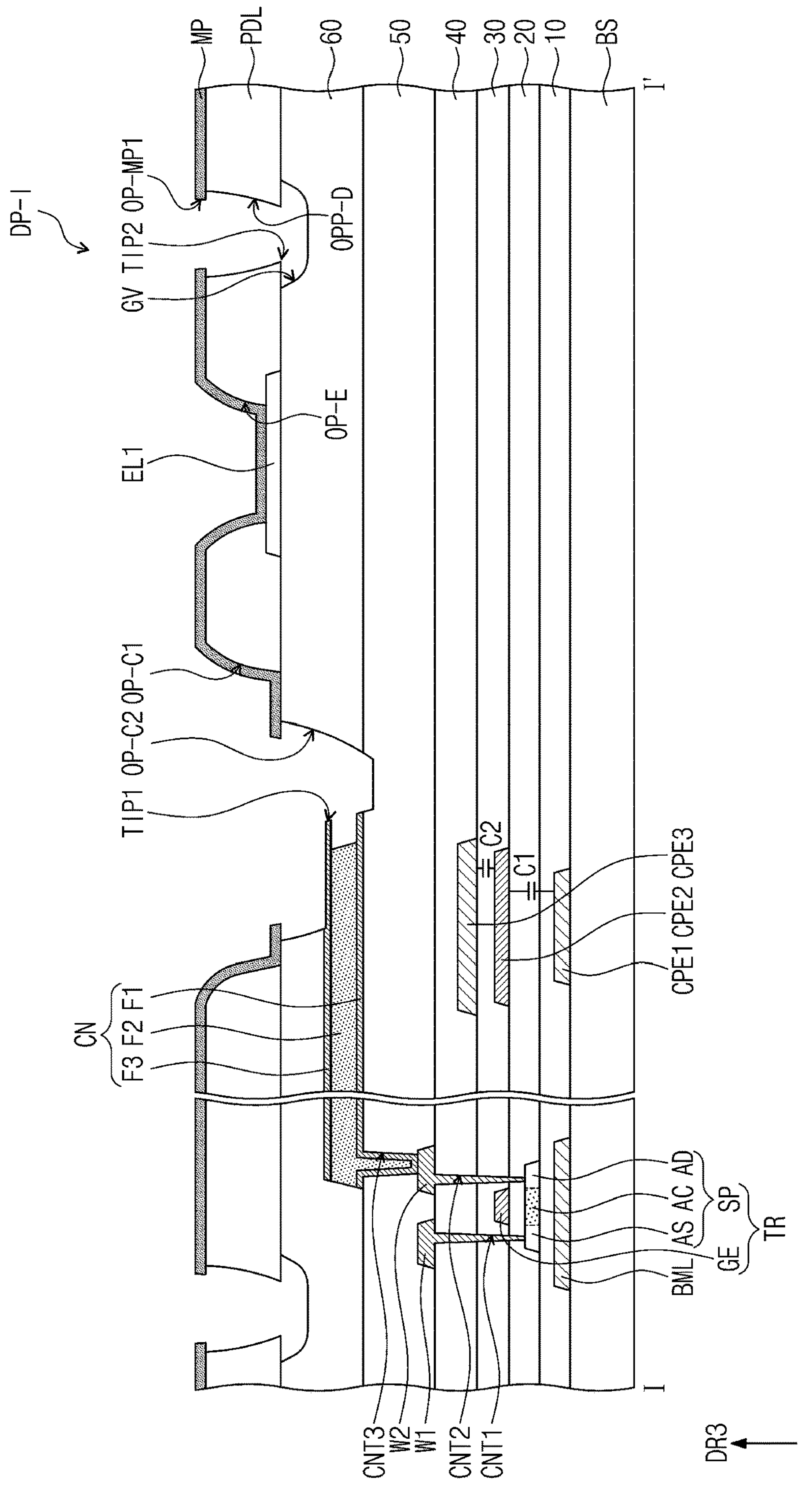

As illustrated in FIG. 8D, the method for manufacturing a display panel according to an embodiment may include the forming of a first tip portion TIP1 in the connection line CN. An end portion of a second layer F2 of the connection line CN exposed from the sixth insulation layer 60 by the first contact opening OP-C1 may be etched. In the embodiment, the etching process of the second layer F2 may be performed by a wet etching method.

In the embodiment, the second layer F2 may have an etch rate greater than that of each of first and third layers F1 and F3, so that the second layer F2 may be etched. Accordingly, an edge of the second layer F2 may be disposed further inside of the connection line CN than an edge of each of the first to third layers F1 and F3. For example, the edge of each of the first and third layers F1 and F3 may further protrude than the edge of the second layer F2, so that the first tip portion TIP1 may be defined on the edge of the third layer F3.

According to the embodiment, before the etching of the pixel definition layer PDL and the sixth insulation layer 60, the connection line CN may be maintained in a state of being covered (e.g., entirely covered) by the sixth insulation 60, and after forming the second tip portion TIP2 of the pixel definition layer PDL, the first tip portion TIP1 may be formed in the connection line CN. For example, since the first tip portion TIP1 is formed in the connection line CN after forming the groove GV and the first contact opening OP-C1 of the sixth insulation layer 60, and the light emitting opening OP-E, the second contact opening OP-C2, and the partition opening pattern OPP-D of the pixel definition layer PDL, it is possible to prevent the first tip portion TIP1 from being damaged by a subsequent process.

In addition, a separate metal pattern for preventing damage which covers an end of the connection line CN may not be disposed. In case that the metal pattern for preventing damage is disposed, the metal pattern may be provided in a state of being extended from an end of the connection line CN to an upper surface of the sixth insulation layer 60 for the stable disposition of the metal pattern. In this case, since an end portion of the metal pattern for preventing damage is covered by the pixel definition layer PDL, a portion of the pixel definition layer PDL that covers the metal pattern for preventing damage may be provided to have a length substantially equal to or greater than a predetermined range. According to the embodiment, since a separate metal pattern for preventing damage is not disposed, there may be no need to secure an additional space for the stable disposition of the metal pattern, so that there may be no or reduced space constraints in implementing a high resolution.

Figure 8E:
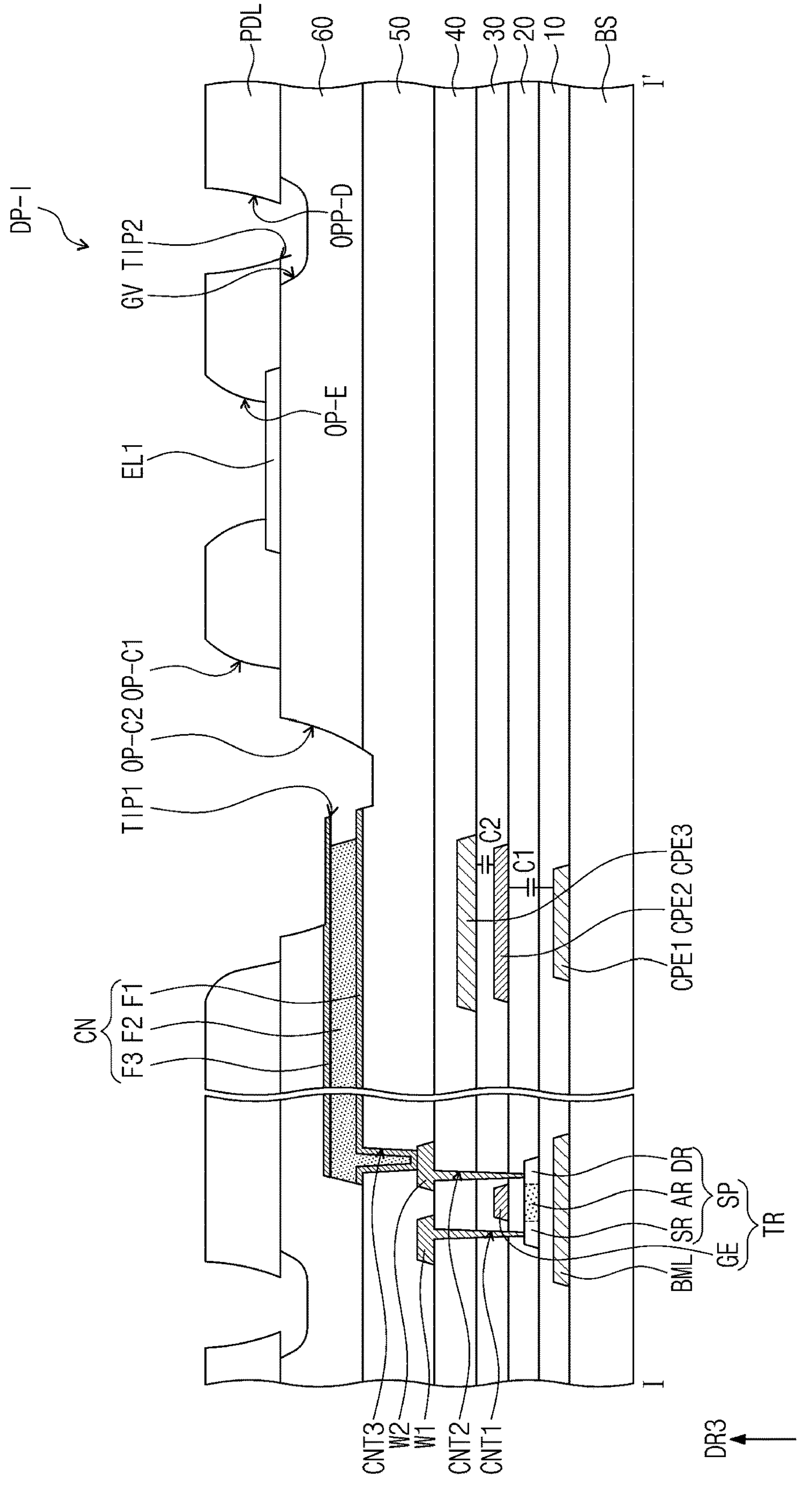

As illustrated in FIG. 8D and FIG. 8E, the method for manufacturing the display panel DP may include the removing of the mask pattern MP. The mask pattern MP may be removed through an etching process. In the embodiment, the etching process of the mask pattern MP may be performed by a wet etching method.

Figure 8F:
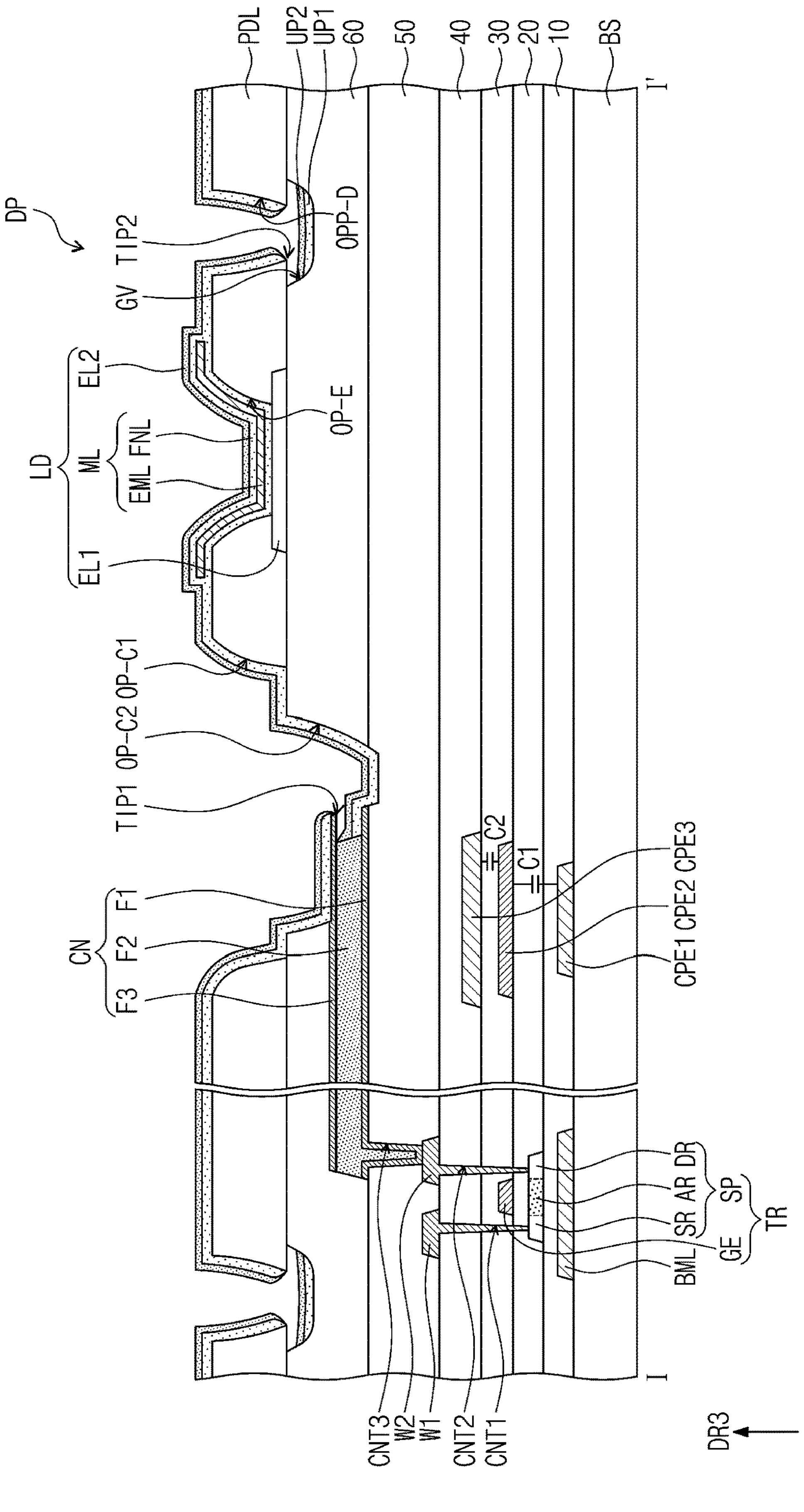

As illustrated in FIG. 8F, the method for manufacturing a display panel according to an embodiment may include the forming of the middle layer ML and the second electrode EL2. In order to form a light emitting element LD, the middle layer ML and the second electrode EL2 may be sequentially disposed on the first electrode EL1.

The middle layer ML and the second electrode EL2 may be formed (e.g., commonly formed) in pixels PXij (see, e.g., FIG. 1) using an open mask, but the middle layer ML and the second electrode EL2 may be disconnected by the second tip portion TIP2 of the pixel definition layer PDL. Accordingly, in the process of forming the middle layer ML, a first partition pattern UP1 spaced apart from the middle layer ML disposed in the partition opening pattern OPP-D and having a same material as the middle layer ML may be formed in the groove GV. In the process of forming the second electrode EL2, a second partition pattern UP2 spaced apart from the second electrode EL2 disposed in the partition opening pattern OPP-D and having a same material as the second electrode EL2 may be formed in the groove GV.

In addition, in the process of forming the second electrode EL2, in order to electrically connect the second electrode EL2 and the connection transistor TR, the second electrode EL2 may be configured to be in contact with a side surface SS-F2 (see, e.g., FIG. 5B) of the second layer F2 of the connection line CN.

Figure 9:
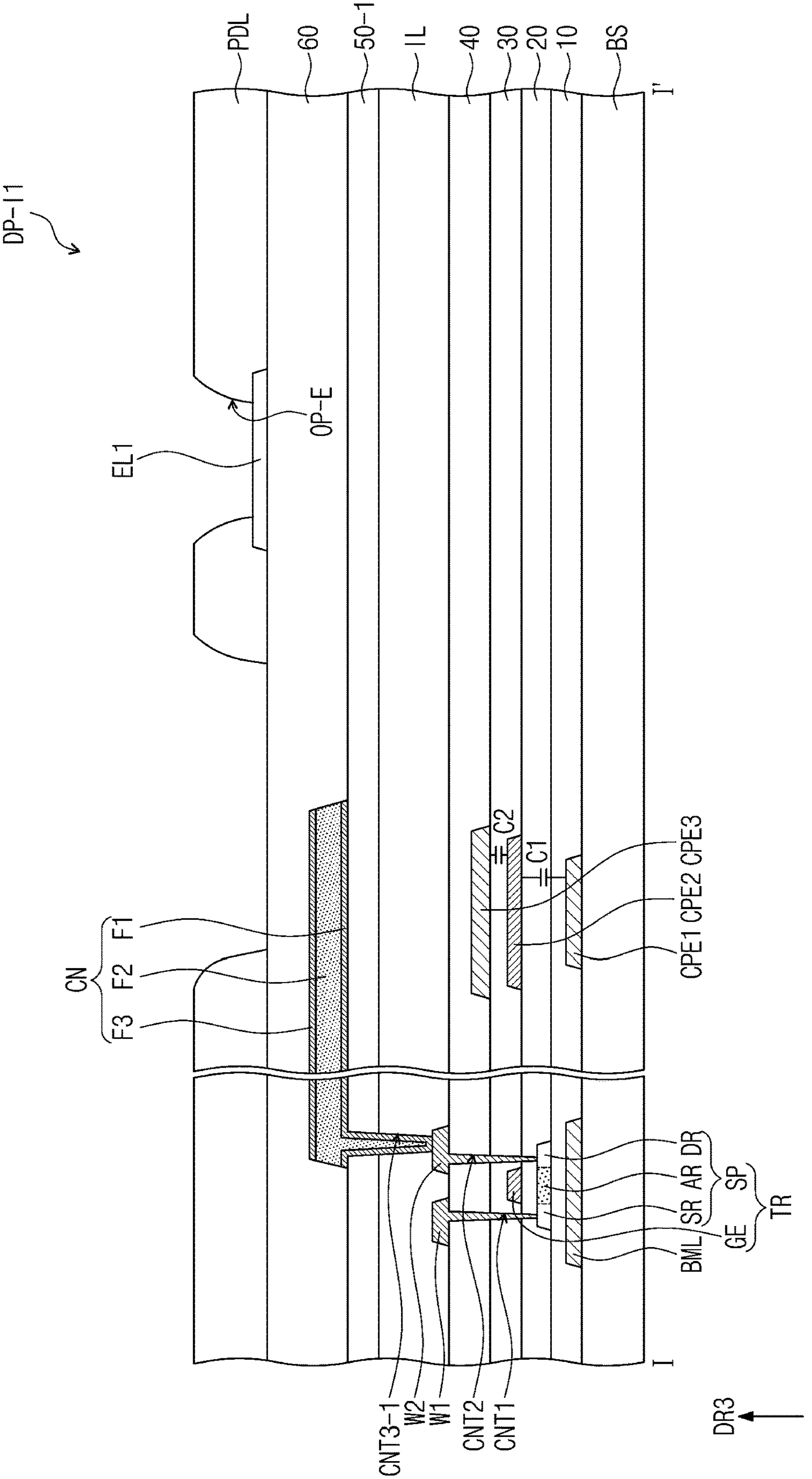
FIG. 9 is a schematic cross-sectional view showing a method for manufacturing a display panel according to an embodiment of the disclosure.

FIG. 9 is a schematic cross-sectional view showing some of steps of a method for manufacturing a display panel according to an embodiment of the disclosure. FIG. 9 illustrates a step of a method for manufacturing the display panel DP-1 described with reference to FIG. 7, and illustrates a step of providing a preliminary display panel DP-I1. The same/similar reference numerals or reference characters are used for the same/similar components as those described with reference to FIG. 1 to FIG. 8F, and redundant descriptions thereof will be omitted.

In the embodiment, the preliminary display panel DP-I1 may include a base layer BS, first to sixth insulation layers 10, 20, 30, 40, 50-1, and 60 disposed on the base layer BS, an additional insulation layer IL disposed between the fourth and fifth insulation layers 40 and 50-1, a connection transistor TR, conductive patterns CPE1, CPE2, CPE3, W1, and W2, a connection line CN disposed between the fifth and sixth insulation layers 50-1 and 60, a pixel definition layer PDL disposed on the sixth insulation layer 60, and a first electrode EL1 disposed on the sixth insulation layer 60. For example, the preliminary display panel DP-I1 according to the embodiment may further include the additional insulation layer IL. The additional insulation layer IL may include an organic insulation material. Thereafter, as described above with reference to FIG. 8B to FIG. 8F, forming a mask pattern MP, etching the pixel definition layer PDL and the sixth insulation layer 60, forming a tip portion in the connecting line CN, removing the mask pattern MP, forming a middle layer ML and a second electrode EL2 may be performed to provide the display panel DP-1 described above with reference to FIG. 7.

According to the disclosure, by providing a tip portion for reducing short-circuit defects of electrodes between adjacent pixels, it is possible to provide a display panel including a light emitting element with improved electrical reliability.

According to the disclosure, by omitting a damage-preventing metal pattern covering a side of a connection line, it is possible to provide a display panel capable of readily implementing a high resolution.

According to the disclosure, by reducing the number of subsequent processes after a process of exposing a side of a connection line, it is possible to provide a method for manufacturing a display panel, the method with improved process reliability.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display panel comprising:
a transistor;
a first insulation layer on the transistor;
a pixel definition layer on the first insulation layer and including,
a light emitting opening; and
an opening pattern surrounding the light emitting opening;
a light emitting element on the first insulation layer and including,
a first electrode, at least a portion of the first electrode being exposed by the light emitting opening; and
a second electrode electrically connected to the transistor; and
a connection line on the transistor and electrically connecting the transistor and the second electrode, wherein
a groove overlapping the opening pattern is defined in the first insulation layer; and
at least a portion of the pixel definition layer protrudes from an edge of the first insulation layer defining the groove toward an inside of the opening pattern.

2. The display panel of claim 1, wherein a side surface of the pixel definition layer defining the opening pattern, a lower surface of the pixel definition layer exposed from the first insulation layer, and a side surface of the first insulation layer defining the groove define a tip portion.

3. The display panel of claim 1, wherein
a width of the opening pattern in a direction decreases as the opening pattern is closer to the groove,
a width of the groove in the direction decreases as the groove is farther from the opening pattern; and
a minimum width of the opening pattern in the direction is less than a maximum width of the groove in the direction.

4. The display panel of claim 1, wherein an etch rate of the first insulation layer is greater than an etch rate of the pixel definition layer.

5. The display panel of claim 1, wherein
the pixel definition layer comprises siloxane; and
the first insulation layer comprises photosensitive polyimide.

6. The display panel of claim 1, further comprising:

a first partition pattern in the groove and spaced apart from the second electrode, and the first partition pattern and the second electrode include a same material.

7. The display panel of claim 1, further comprising:

a second partition pattern in the groove, wherein the light emitting element further comprises a middle layer between the first electrode and the second electrode, the second partition pattern and the middle layer include a same material, and the second partition pattern is spaced apart from the middle layer.

8. The display panel of claim 1, further comprising:

a second insulation layer on a lower side of the first insulation layer and between the transistor and the connection line, wherein a first contact opening exposing an end portion of the connection line is defined in the first insulation layer.

9. The display panel of claim 8, wherein the connection line comprises:

a first layer;

a second layer on the first layer; and a third layer on the second layer, the third layer and the first layer including a same material, wherein a side surface of the second layer adjacent to the second electrode is further inside of the connection line than a side surface of each of the first layer and the third layer, and the second electrode is in contact with the side surface of the second layer.

10. The display panel of claim 9, wherein a first thickness of the third layer overlapping the first contact opening is less than a second thickness of the third layer not overlapping the first contact opening.

11. The display panel of claim 8, wherein a recessed portion recessed in a thickness direction of the second insulation layer, overlapping the first contact opening, and not overlapping the connection line is defined in the second insulation layer.

12. The display panel of claim 8, wherein an etch rate of the second insulation layer is less than an etch rate of the first insulation layer.

13. The display panel of claim 8, wherein the second insulation layer comprises an organic insulation material.

14. The display panel of claim 13, wherein the first insulation layer comprises photosensitive polyimide; and the second insulation layer comprises siloxane.

15. The display panel of claim 8, further comprising:

a third insulation layer between the second insulation layer and the transistor and including an organic insulation material, wherein the second insulation layer comprises an inorganic insulation material.

16. A display panel comprising:

a transistor;

a first insulation layer on the transistor;

a pixel definition layer on the first insulation layer and including, a light emitting opening; and an opening pattern surrounding the light emitting opening;

a light emitting element on the first insulation layer and including, a first electrode, at least a portion of the first electrode being exposed by the light emitting opening; and a second electrode electrically connected to the transistor; and a connection line on the transistor and electrically connecting the transistor and the second electrode, wherein a groove overlapping the opening pattern and a first contact opening exposing an end portion of the connection line are defined in the first insulation layer; and the second electrode is electrically connected to the end portion of the connection line.

17. The display panel of claim 16, wherein the connection line comprises:

a first layer;

a second layer on the first layer; and a third layer on the second layer, wherein at the end portion, a side surface of the second layer is further inside than a side surface of each of the first layer and the third layer; and at least a portion of the third layer more protruding than the side surface of the second layer defines a first tip portion.

18. The display panel of claim 17, wherein a first portion of the second electrode in the first contact opening is on the first tip portion, and a second portion of the second electrode in the first contact opening is in contact with the side surface of the second layer.

19. The display panel of claim 17, further comprising:

a second insulation layer on a lower side of the first insulation layer and between the transistor and the connection line, wherein the light emitting element further comprises a middle layer between the first electrode and the second electrode, a first portion of the middle layer covers an upper surface of the third layer exposed by the first contact opening, and a second portion of the middle layer covers the second insulation layer exposed by the first contact opening.

20. The display panel of claim 19, wherein the transistor and the connection line are electrically connected through a contact-hole passing through the second insulation layer.

21. The display panel of claim 16, wherein a second contact opening corresponding to the first contact opening, spaced apart from the light emitting opening, and surrounded by the opening pattern is defined in the pixel definition layer; and a planar area of the second contact opening is substantially equal to or greater than a planar area of the first contact opening.

22. The display panel of claim 16, wherein a portion of the pixel definition layer protrudes from an edge of the first insulation layer defining the groove toward an inside of the opening pattern; and a side surface of the pixel definition layer defining the opening pattern, a lower surface of the pixel definition layer exposed from the first insulation layer, and a side surface of the first insulation layer defining the groove define a second tip portion.

* * * * *